US008102893B2

(12) United States Patent
Giaretta et al.

(10) Patent No.: US 8,102,893 B2
(45) Date of Patent: Jan. 24, 2012

(54) MULTIPLE EMITTER VECSEL

(75) Inventors: Giorgio Giaretta, Mountain View, CA (US); Arvydas Umbrasas, Cupertino, CA (US); Michael Jansen, Palo Alto, CA (US)

(73) Assignee: Necsel Intellectual Property, Milpitas, CA (US)

(*) Notice: Subject to any disclaimer, the term of this patent is extended or adjusted under 35 U.S.C. 154(b) by 41 days.

(21) Appl. No.: 12/139,217

(22) Filed: Jun. 13, 2008
(Under 37 CFR 1.47)

(65) Prior Publication Data
US 2009/0296752 A1  Dec. 3, 2009

Related U.S. Application Data

(60) Provisional application No. 60/944,021, filed on Jun. 14, 2007, provisional application No. 60/979,753, filed on Oct. 12, 2007.

(51) Int. Cl.
*H01S 5/00* (2006.01)

(52) U.S. Cl. .............................. 372/50.124; 372/50.12
(58) Field of Classification Search ............ 372/50.11, 372/50.12, 50.124, 53
See application file for complete search history.

(56) References Cited

U.S. PATENT DOCUMENTS

| 5,812,571 | A * | 9/1998 | Peters | 372/36 |
| 6,393,038 | B1 * | 5/2002 | Raymond et al. | 372/22 |
| 2003/0099273 | A1 * | 5/2003 | Murry et al. | 372/108 |
| 2006/0029112 | A1 * | 2/2006 | Young et al. | 372/7 |
| 2009/0059975 | A1 * | 3/2009 | Brilliant et al. | 372/22 |

* cited by examiner

*Primary Examiner* — Armando Rodriguez
(74) *Attorney, Agent, or Firm* — Douglas L. Weller

(57) ABSTRACT

An extended cavity surface emitting laser has a first laser die with a first cavity and a first gain element and a second laser die with a second cavity and a second gain element. The first and second gain elements are in series to provide optical gain and optical feedback in an extended optical cavity configuration. The first and second gain elements provide optical gain and optical feedback in a common extended cavity with the first and second gain elements operating serially as a common extended cavity optical mode.

51 Claims, 17 Drawing Sheets

MULTIPLE EMITTER VECSEL

CROSS-REFERENCE TO RELATED APPLICATION

This application claims the benefit of U.S. Ser. Nos. 60/944,021 filed Jun. 14, 2007 and 60/979,753 filed Oct. 12, 2007, both of which applications are fully incorporated herein by reference.

BACKGROUND OF THE INVENTION

1. Field of the Invention

The present application relates generally to surface emitting lasers, and more particularly to extended cavity surface emitting lasers.

2. Description of the Related Art

An individual VECSEL includes a gain element, which is typically a semiconductor die that includes a quantum well gain region and at least one distributed Bragg reflector (DBR). An individual gain element is also fashioned to restrict current injection to a desired region about the quantum well gain region. Spaced apart from the gain element is an element that functions as a mirror and which defines an "extended cavity." Thus, an individual single emitter VECSEL has one gain element disposed within a single VECSEL laser cavity. A nonlinear optical crystal is often included in the extended cavity between the gain element and the mirror to generate frequency doubled light from a fundamental frequency of the VECSEL via intra-cavity second harmonic generation (SHG).

There are a number of limitations of a conventional single emitter VECSEL cavity design. One drawback is that the output power is typically thermally limited. Waste heat from current injection causes the temperature of the gain element to rise. At high currents the die temperature becomes too hot for efficient operation.

One technique that is used to increase the output power is to increase the emitting aperture of the VECSEL. However, there are limits on how much the output power can be increased by increasing the emitting aperture. That is, it is not possible to arbitrarily increase the size of the emitting aperture of a VECSEL to increase power. Transverse mode instabilities tend to set in at large apertures. The gradients in optical attributes across the emitter surface of the VECSEL also tend to become too large for stable operation beyond a certain aperture size. The SHG efficiency also drops, because the fundamental beam waist becomes too large.

One approach that has been attempted to address the limitations of single emitter VECSELs is a parallel architecture. FIG. 1 illustrates a parallel architecture array of surface emitting lasers, which is described in more detail in U.S. Ser. No. 11/193,317, the contents of which are hereby incorporated by reference. An individual laser array is composed of a monolithic planar array of VECSEL surface emitting emitters formed on one die 105. Thus, all of the individual lasers in the array will be formed with similar quantum well active region layers and DBR layers. Semiconductor fabrication techniques are used to restrict the flow of current to define an array of pumped gain regions in the die. A common external optic 137, which could be reflective, diffractive or refractive, is spaced apart from the die. By way of a non-limiting example, the optic 137 can be a Volume Bragg Grating or VBG, which provides spectrally narrow reflectivity. Note that this external optic defines parallel extended cavities and the individual lasers are spaced far enough apart that all of the lasers in the array operate in parallel. In frequency shifted applications, a common nonlinear, converter 135, such as second harmonic generator, may be included in the extended cavity for all emitters of the array.

A parallel VECSEL architecture has an output power that theoretically scales with the number of individual emitters. That is, at best, a parallel VECSEL architecture increases output power by the single emitter output multiplied by the number of emitters. However, practical considerations make it difficult to achieve a true scaling of output power. One effect that limits the capabilities of a parallel VECSEL architecture is that in practice it is difficult to simultaneously optimize performance of all the emitters in a larger array, which reduces output power. One reason for this is that the VESCEL array must be very flat for all the parallel cavities to be aligned simultaneously using a single external optic to provide the cavity feedback. However, as the lateral dimensions (e.g. width) of the array are increased, the small amounts of curvature that are naturally present in the semiconductor structure due to dissimilar material properties through the device and packaging structure mean that the necessary alignment becomes harder to achieve, thus reducing the optical power yield for large area arrays, i.e. for a given radius of curvature of the array die within the package, the angular and lateral misalignments of the optical path at the outer ends of the array increase as the size of the array increases. Eventually, as the array size and misalignments increase, the optical losses for the outer elements becomes high enough to significantly reduce their lasing efficiency, or even prevent their lasing altogether. Since the cavity feedback can be provided (for reasons of cost alignment simplicity) by the single common external optic, the alignment of the optic cannot be adjusted independently across the array to optimize individual emitters to correct for the laser die curvature.

The VECSEL die size is also constrained by mechanical considerations. The die size cannot be arbitrarily large because mechanical fragility will compromise manufacturability. This is true both of the handling and processing of the bare die, and due to the effects of thermal expansion mismatch in the mounting of the bare die to a carrier or the submount/heatsink within the package. Since it is in general impossible to provide a perfect thermal expansion match between the VECSEL die and the carrier or submount, as the die size is increased the linear expansion difference between the components during the fabrication processing and laser operation is increased. Thus, as the die size is increased the stresses applied to the die are also increased and eventually this can lead to cracking and failure of the die, especially if the packaged die is subjected to multiple thermal cycling events, as can occur when the laser system is turned on and off. Thermal expansion mismatch of the die and carrier or submount can also result in curvature of the die, which can provide performance variations over temperature. The use of "hard" solders, such as gold-tin, to perform the bonding of the die to the carrier or submount, which are desirable for long term reliability due to their chemical inertness and resistance to voiding and creep, effectively prevents any strain relief between the die and carrier, magnifying the mechanical effects of thermal expansion mismatch. (the use of "soft" e.g. indium solders for the mounting of the die does allow some strain relief, but these solders are less stable and more subject to property changes and creep during operation at the high temperature interface between the die and the carrier/submount.)

Thermal effects also limit the total power that can be produced by a VECSEL array. As the array size is increased it becomes harder to extract the waste heat generated in the semiconductor material efficiently from under the relatively small footprint of the array. Due to these heat extraction limitations there is thermal cross-talk between the emitters in the array, such that the average temperature of the emitters in the array is increased compared to the temperature of a single emitter which is pumped at the same electrical drive levels. It should be noted that these heat extraction limitations are exacerbated by the increase in die size. As the die size is increased the mechanical expansion effects described above force the use of thermally expansion matched carriers or submounts to attach the die. In general, the materials that provide the best expansion match to the die do not necessarily provide the best thermal conductivity and heat removal. For instance, diamond provides very high heat conductivity and allows the laser emitters to operate at a lower temperature for a given drive current, therefore maximizing output power and efficiency, but the thermal expansion mismatch is too high to allow bonding with hard solders.

Another drawback of a VECSEL array is that the system efficiency is inherently low. A harmonic converter needs high power at the fundamental frequency to achieve efficient second harmonic conversion of light at the fundamental frequency to the second harmonic. However, it can be difficult to achieve a high power at the fundamental frequency in a VECSEL. Principally, the gain in a VECSEL emitter is inherently low because the gain region is very thin, comprising only the thickness of the epitaxially grown quantum wells, and thus the single pass gain is typically only a few percent. Since a number of optical elements are required to form the external cavity for the frequency doubled VECSEL a number of inherent losses are added to the cavity which degrade the laser performance. Although all the cavity elements can be optimized using anti-reflection coatings and high reflectivity coatings where necessary, there are always some residual reflection and transmission losses from the optical coatings, and some small absorption losses related to transmission through some of the components. Overcoming these cavity losses with the relatively low gain VECSEL emitter limits the attainable output power and the efficiency of the laser system. Thus the opportunity to minimize the number of cavity components required per VECSEL gain element is desirable for improving the laser system output power and efficiency.

Additionally, there are practical limitations on the output mode quality in a parallel architecture. The VECSEL array functions as an array of independent lasers with as many beams as emitters. As a result, if the output power of the laser system is scaled by increasing the lateral dimensions of the array, the output beams are spread over a larger area and the output of the VECSEL array is more difficult to focus to a small spot.

SUMMARY OF THE INVENTION

An object of the present invention is to provide an improved VECSEL.

Another object of the present invention is to provide an extended cavity surface emitting laser.

Yet another object of the present invention is to provide an extended cavity surface emitting laser that has a first laser die with a first cavity and a first gain element and a second laser die with a second cavity and a second gain element.

A further object of the present invention is to provide an extended cavity surface emitting laser with first and second gain elements in series to provide optical gain and optical feedback in an extended optical cavity configuration These and other objects of the present invention are achieved in an extended cavity surface emitting laser that has a first laser die with a first cavity and a first gain element and a second laser die with a second cavity and a second gain element. The first and second gain elements are in series to provide optical gain and optical feedback in an extended optical cavity configuration. The first and second gain elements provide optical gain and optical feedback in a common extended cavity with the first and second gain elements operating serially as a common extended cavity optical mode.

In another embodiment of the present invention, an extended cavity surface emitting laser system includes a first electrically pumped surface emitting gain element and a second electrically pumped surface emitting gain element, each having an internal Bragg reflector. The second electrically pumped surface emitting gain element is spaced apart from the first electrically pumped surface emitting gain element. The first and second surface emitting gain elements are optically coupled to form an extended optical cavity in which one surface emitting gain element is disposed at each end of an optical path of the extended optical cavity. Each surface emitting gain element emits light at a fundamental frequency into the extended optical cavity. A harmonic converter is positioned in the optical path of the extended cavity. An output coupler extracts frequency doubled light generated by the harmonic converter.

In another embodiment of the present invention, an extended cavity surface emitting laser system includes at least two electrically pumped surface emitting gain elements, each having an internal Bragg reflector. The surface emitting gain elements are spaced apart from another and generate light at a fundamental frequency. An optical coupler couples the emission output of each surface emitting gain element in series as part of a common extended cavity. A harmonic converter provides intra-cavity frequency doubling and an output coupler extracts frequency doubled light.

In another embodiment of the present invention, a method is provided of generating frequency doubled light. First and electrically pumped surface emitting gain elements, each with an internal Bragg reflector, are provided. The first and second surface emitting gain elements are optically coupled into an extended cavity, with the surface emitting gain elements at different ends of the extended cavity. An intracavity harmonic converter is used to perform frequency doubling.

In another embodiment of the present invention, a laser system includes at least two electrically pumped surface emitting gain elements, each with an internal Bragg reflector, to generate light at a fundamental frequency. Means are provided for optically coupling the surface emitting gain elements into an extended cavity. An intracavity harmonic converter performs frequency doubling and an output coupler extracts frequency doubled light.

In another embodiment of the present invention, an extended cavity surface emitting laser system includes at least two electrically pumped surface emitting gain elements spaced apart from each other to generate light at a fundamental frequency. The surface emitting gain elements include a Bragg reflector. An optical coupler couples emission output of each surface emitting gain element in series as part of a common extended cavity. A harmonic converter provides intra-cavity frequency doubling. An output coupler is positioned to extract frequency doubled light from the common extended cavity. The optical coupler includes at least one of, an intracavity lens, a mirror, a dichroic reflector, a prism, a beam splitter, a high refractive index element, an optical tuning element, a turning mirror and a grating.

In another embodiment of the present invention, an extended cavity surface emitting laser system includes at least two electrically pumped surface emitting gain elements, each with a Bragg reflector, spaced apart from each other to generate light at a fundamental frequency. An optical coupler couples the emission output of each surface emitting gain element in series as part of a common extended cavity. A harmonic converter provides intracavity frequency doubling. The common extended cavity is a folded cavity that makes at least one turn along an optical path of the extended cavity.

In another embodiment of the present invention, a laser system includes at least two electrically pumped surface emitting gain elements to generate light at a fundamental frequency. Each surface emitting gain element has an internal Bragg reflector. Means are provided for optically coupling the surface emitting gain elements into a folded extended cavity in which the optical path of the extended cavity makes at least one turn. An intracavity harmonic converter is provided to perform frequency doubling. An output coupler extracts frequency doubled light.

DETAILED DESCRIPTION OF THE PREFERRED EMBODIMENTS

Conventional VECSELs with a parallel cavity array architecture utilizing a single gain element per parallel laser cavity have limitations on the useful power that can be achieved for the reasons described above, including the requirement for multiple additional optical elements such as volume Bragg gratings.

Figure 2:
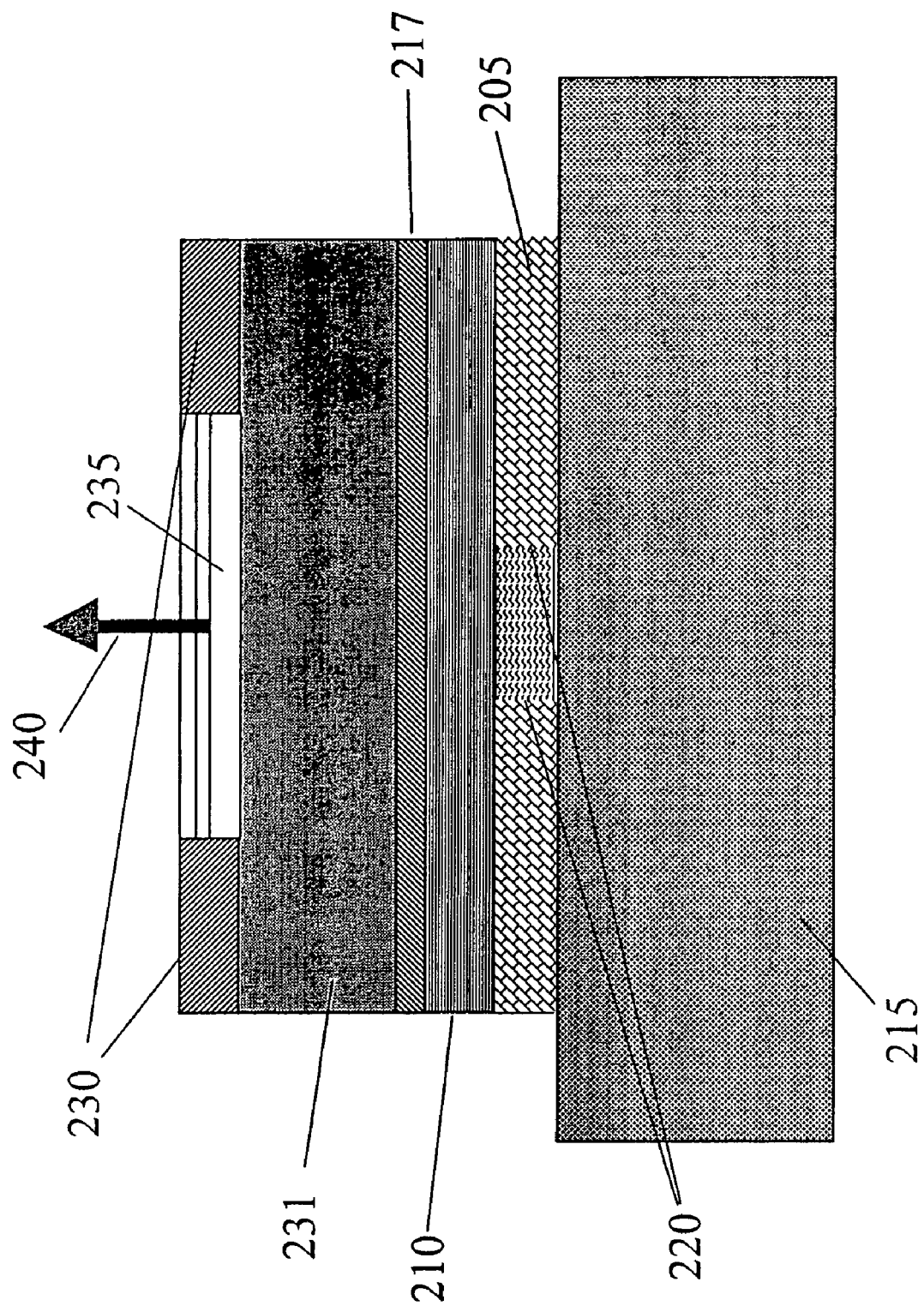
FIG. 2 is a schematic diagram of structure of representative die in accordance with one embodiment of the present invention.

In accordance with the present invention, a serial architecture is disclosed that permits surface emitting dies having VECSEL gain elements (of either individual or parallel emitters) to be arranged in a serial fashion within a single laser cavity. This approach of coupling two or more elements or emitters in series in an extended cavity configuration permits higher output powers to be achieved. This approach enables scaling of the laser output power compared to the capabilities of a system based on a single emitter cavity. The power scaling is achieved by increasing gain available in the laser cavity while simultaneously reducing the number of optical components per gain element. Thus, the serial architecture of the present invention enables increased output power and improved efficiency as compared to the output of prior art single-gain-element-per-cavity based systems. In addition, since the serial architecture enables a reduction in the number of optical components per gain element, the number of optical components per watt of output power can be reduced and thus the dollar cost-per-watt of output power reduced. This makes the serial architecture device attractive for many laser illumination applications where cost is an important factor FIG. 2 illustrates one embodiment of an exemplary individual gain element or emitter of a VECSEL die. The VECSEL die is designed to emit a vertical output perpendicular to the plane of the epitaxially grown layers. Additional details are described in U.S. Pat. Nos. 6,243,407; 6,404,797; 6,778, 582; 6,898,225; and 7,189,589, incorporated herein by reference. The gain element is fabricated using well known epitaxial techniques and includes a highly reflective p-DBR 205 mirror epitaxially fabricated on the base of a die, and a gain region 210 consisting of one or more quantum wells appropriately positioned in regions of high optical field strength. An intermediate n-DBR mirror 217 is epitaxially fabricated on the opposite side of the gain region from the p-DBR and is partially transmissive at the emission wavelength. A current limiting aperture 220 is fabricated on the die, e.g. by proton implantation. A typical current aperture diameter is 80 to 200 microns. The current aperture is typically circular, but could be square, rectangle, ellipse, or other shape. A first electrode is fabricated on the p-DBR at the base of the die, which may be electrically connected to the submount 215. An opposing electrode 230 is fabricated on the opposing or top surface (which is also the surface of the n-doped substrate 231 on which the epitaxial layers were grown) of the die with a metal contact ring that surrounds the optical aperture. An anti-reflection coating 235 is applied to the top die surface to provide low loss output transmission for the fundamental emission wavelength 240. In operation, current injected into the quantum wells through the aperture causes optical gain. The current also creates a thermally induced lens due to a radial temperature gradient across the aperture of the dies. The thermal lens serves to stabilize the cavity transverse mode, and the strength of the lens determines the mode size of the fundamental Gaussian mode within the laser cavity. The current induced thermal lens is generally positive in nature, i.e. acts as a convex lens, focusing the emitted light from the die.

Figure 3:
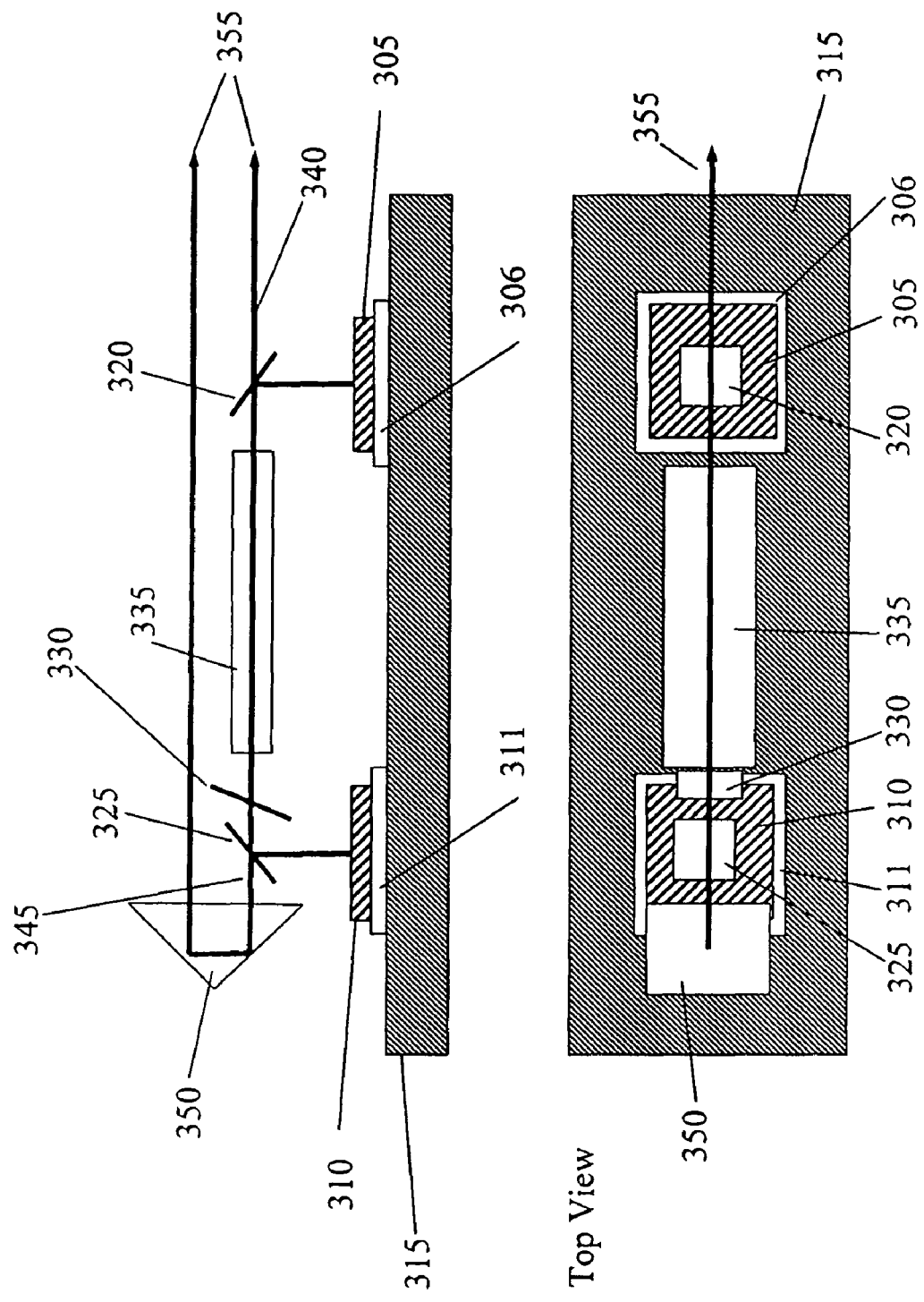
FIG. 3 is a schematic diagram of single VECSEL cavity with two dies, arranged in series, at each end of the laser cavity, in accordance with one embodiment of the present invention.

In one embodiment of the present invention, the gain element or emitter fabricated in the VECSEL die of the present invention does not lase in the absence of the other elements of the extended cavity. In this regard, the reflectivity or feedback from the epitaxially grown n-DBR structure is not sufficient to achieve lasing action in the absence of another reflector external to the VECSEL die. In the cavity of FIG. 3 the external cavity is formed between the p-DBR mirrors on the two die, incorporating the two folding mirrors to achieve the required optical alignment. Thus in the serial laser architecture of FIG. 3 each die effectively forms the external feedback mirror that enables the other die to lase.

FIG. 3 illustrates a basic serial cavity architecture in accordance with one embodiment. The serial cavity architecture ("serial architecture") is a serial architecture in that the gain elements of a set of laser dies 305, 310 act in a series fashion to provide optical gain and optical feedback in an extended optical cavity configuration. The two dies may be said to be coupled together to form an extended optical cavity. In this embodiment the two laser dies are located at the two ends of the extended cavity and the epitaxial Bragg reflectors grown on the laser dies form the end mirrors of the extended cavity. In the serial architecture gain elements from different dies provide optical gain and optical feedback in a common extended cavity such that each set of laser gain elements operating serially has a common extended cavity optical mode. That is, in a round trip through a particular extended cavity, a photon at the fundamental frequency traverses the gain elements of the dies serially. Thus, the effective gain available in the cavity is doubled, and in the an embodiment where the intracavity losses of the serial architecture have not increased by a factor of two compared to the single emitter based cavity, the laser output power may be expected to increase by at least a factor of 2 or more. The lasing threshold condition in the serial architecture can be calculated by one of ordinary skills in the art for a particular cavity by taking into account the gain and feedback losses in a round trip through all of the elements of the extended cavity, including the gain elements of the set of laser dies.

As used in this application, "dies" is the plural of "die," although some dictionaries also refer to the plural of die as "dice." An individual laser die is a portion of a processed substrate, and may contain one or more individual gain elements. The substrate from which a laser die is formed has epitaxial layers grown on it which have been further processed to form a gain element(s), as will be described below in more detail. For a VECSEL die the laser die may, for example, have epitaxially grown semiconductor gain layers and DBR (Distributed Bragg Reflector) mirror layers combined with electrical contacts and current limiting apertures that have been fabricated to restrict an electrical pumping current to the area of a desired gain element. The electrical contacts and the current limiting aperture effectively define the size and shape of the laser emitter. A typical emitter may be round with a diameter of 80-200 microns, but may also be square, rectangular, oval or elliptical. An individual gain element of a die can also be described as an individual emitter, since it emits light at a fundamental frequency into the extended cavity.

In the embodiment of FIG. 2, two VECSEL dies 305, 310 are mounted to a submount or heatsink 315. Each VECSEL die contains a gain element which is designed to support at least one common emission wavelength in the cavity. In one implementation, both VECSEL dies and their respective gain elements are fabricated using an essentially identical semiconductor layer structure and are pumped in essentially the same manner (i.e. the electrical pumping characteristics of voltage, current and pulse duration are substantially the same). That is, in one implementation the VECSEL dies and gain elements are symmetric in terms of physical properties and operation. However, more generally, the VECSEL dies and gain elements do not have to be symmetric structures or be pumped identically as long their emission wavelengths are similar such that they can act in series to provide optical gain and feedback to the common cavity modes of an extended cavity. In particular, in some applications a deliberate asymmetry in physical properties and/or operation of each gain element may be desirable. As one example of an asymmetric design, each VECSEL die may have gain elements (emitters) of different diameter, or even different shapes. As another example of an asymmetric design the DBR mirror in each die may be slightly different in design, such as having different distributed Bragg reflector (DBR) structures (e.g., different n-DBR layer sequences). This can yield for instance a difference in reflectivity of the n-DBR between the dies, which alters the ratio between the optical power in the extended cavity and that within the Fabry Perot gain cavity of each emitter. Other potential asymmetric design options include different substrate thicknesses, and different size current limiting apertures. The different dies may be driven either in series or in parallel. Additionally, different currents may be applied to each die.

The submount 315 serves as a heatsink. Note that the two dies 305, 310 are spaced apart on the submount 315 which improves the capability to dissipate heat. The dies may be mounted with solder for good thermal connection between die and submount. The separation of the dies minimizes the thermal cross talk between the emitters on the dies, providing a lower average emitter operating temperature than would be the case for similarly driven emitters located adjacent to each other on the same die.

The common submount/heatsink can be made of copper or some other high thermal conductivity material so that the waste heat generated in the VECSEL die during laser operation can be efficiently removed to maximize the laser performance. The die may be directly mounted to the submount/heatsink using solder to provide efficient thermal and electrical connection. Alternatively, the die 305 may be mounted to a carrier 306, comprising for instance a ceramic material which may be chosen to provide close thermal expansion matching to the die, while maintaining high thermal conductivity. Examples of such materials are BeO, (beryllium oxide) AlN (aluminum nitride) and copper plated AlN. The use of a thermal expansion matched carrier for the die isolates the die from the potential deleterious effects of thermal cycling and stress and strain damage which may occur during operation if the dies are bonded directly to the submount/heatsink. The physical separation of the dies on the submount enables the use of lower thermal conductivity carrier materials that are better thermal expansion matched to the dies, while maintaining sufficient heat removal capability to maintain the emitter operating temperature low enough for efficient laser operation.

As previously described, in one embodiment the two dies each have similar optical characteristics, in what may be described as a "symmetric" configuration in which the characteristics of each die are carefully matched to within a preselected tolerance. For example, fabrication details, such as an implanted current blocking aperture may be chosen to be identical and an N-side electrical contact could be identical. The thermal resistance of each die could also be selected to be similar. The emission wavelength (which may be defined as the natural emission wavelength of the VECSEL die at a given temperature using a broadband output coupler to provide sufficient feedback to complete the external cavity and enable laser action. This emission wavelength is determined by an overlap between the optical gain spectrum of the semiconductor quantum wells, and the Fabry Perot reflectivity spectrum of the cavity formed by the n- and p-DBR mirror stacks grown on the laser die) may be selected to be within a preselected tolerance, such as to within about 2 nm. The die's thermal properties, such as any thermal lensing effect (thermal lens) in each die may also be selected to be similar. The dies may be selected to have similar light versus current performance. One way to match the optical characteristics of two dies is to select dies from the same wafer, preferably from the same area of the wafer to minimize performance differences. However, the two dies do not have to be interferometrically matched (that is, they do not have to have exactly identical performance in any of the criteria listed above).

The spontaneous emission from each die is directed by external turning mirrors 320, 325 situated above each die, as illustrated in FIG. 2, creating a "flattened" U-shaped cavity. The external mirrors and other intracavity components form a coupling system that couples light emitted by one die to the other. The external mirrors 320, 325 may be fabricated from a substrate of a transparent optical material, such as fused silica or a suitable glass. Optical coatings can be deposited on both surfaces of the substrate material. The optical coating properties can be tailored so that the turning mirrors have different reflectivities for p- or s-polarized fundamental light to create a differential loss between the polarization states to force the laser cavity to oscillate in the low loss polarization state, creating a high extinction ratio polarized laser. The external mirrors can have a highly reflective coating at the emission wavelength of the die (i.e., the fundamental wavelength). The coating also typically has a low reflectivity at the second harmonic wavelength. The two turning mirrors are aligned to direct the emission of each die towards each other forming a single laser cavity. Thus, the extended cavity includes the two laser dies 305, 310 and the two turning mirrors 320, 325.

The extended cavity can include a spectral filter 330 inserted in the cavity to force laser oscillation in a narrow spectral band. An exemplary spectral filter is described in U.S. Ser. No. 11/396,289, the contents of which are hereby incorporated by reference.

In one embodiment, the extended cavity includes a nonlinear optic harmonic converter 335 placed in the laser cavity to convert the fundamental die emission wavelength to a second harmonic wavelength. The nonlinear optic harmonic converter 335 can be based on a periodically-poled lithium niobate (PPLN) crystal. However, other materials are possible, for example periodically poled lithium tantalate (PPLT), periodically poled KTP, conventional lithium niobate, potassium niobate, BBO, LBO, or KTP. Preferably periodically poled magnesium doped lithium niobate may be used for the nonlinear optic harmonic converter (frequency converter) to minimize the effects of photorefractivity on the performance of the visible laser.

The harmonic converter is can be placed at or around the midpoint of the laser cavity since in the simple cavity shown in FIG. 3 the optical cavity mode size is smallest in this region. This configuration yields the highest intensity of the fundamental light within the harmonic converter and thus the highest conversion efficiency. The circulating fundamental power passes through the harmonic converter in both directions and hence the harmonic converter generates second harmonic light in both directions.

The harmonic converter is can be mounted on a temperature controlled plate (not shown) so that the phase matching condition is satisfied to efficiently generate the second harmonic. It is very convenient to mount this plate referenced off the submount since they are parallel surfaces separated by several millimeters. The temperature controlled plate can provide a uniform temperature environment for the harmonic converter such that the phasematching condition is uniform throughout the converter for maximum conversion efficiency. Alternatively, the temperature controlled plate may provide a non-uniform temperature environment for the harmonic converter, for instance such that the phasematching condition is non-uniform through the converter, resulting in a broader bandwidth for the harmonic conversion.

The laser system functions as an optical resonator for light at the fundamental frequency and hence the harmonic converter receives fundamental light traveling in two opposed directions through the harmonic converter. It will therefore be understood that an aspect of the optical geometry is that there is a second harmonic beam generated in the harmonic converter in a first direction 340 ("the forward direction") and a second, opposite direction 345 ("the reverse direction" or the "backwards" direction). In one embodiment only one of the second harmonic beams (e.g. the forward directed beam) is output. However, in one embodiment the other second harmonic beam (e.g., the backwards directed beam) is redirected such that both second harmonic beams are output in the same direction, substantially parallel to each other. In one embodiment the backward traveling second harmonic light 345 passes through the turning mirror 325 and an optical element, such as a prism 350, is placed adjacent to the mirrors 325 to redirect the second harmonic light so that both second harmonic beams are output nominally parallel 355. In this embodiment, the turning mirrors 320, 325 act as output couplers to efficiently couple or extract the generated second harmonic light out of the cavity.

The cavity can be designed to support a fundamental Gaussian mode and also operated in the fundamental Gaussian mode. A combination of computer-aided design techniques and empirical investigations may be used to achieve the fundamental Gaussian mode for a particular design. For example, in a particular application, the drive current, current aperture diameter of the emitter formed in the VECSEL die, and the optical cavity length may be optimized so that the cavity supports a fundamental Gaussian mode.

Referring to the serial architecture laser cavity of FIG. 3, the two dies can be electrically coupled in series. A serial electrical connection of the dies allows use of a lower current, higher voltage source than a parallel electrical architecture. A serial connection is also electrically more efficient.

Figure 4:
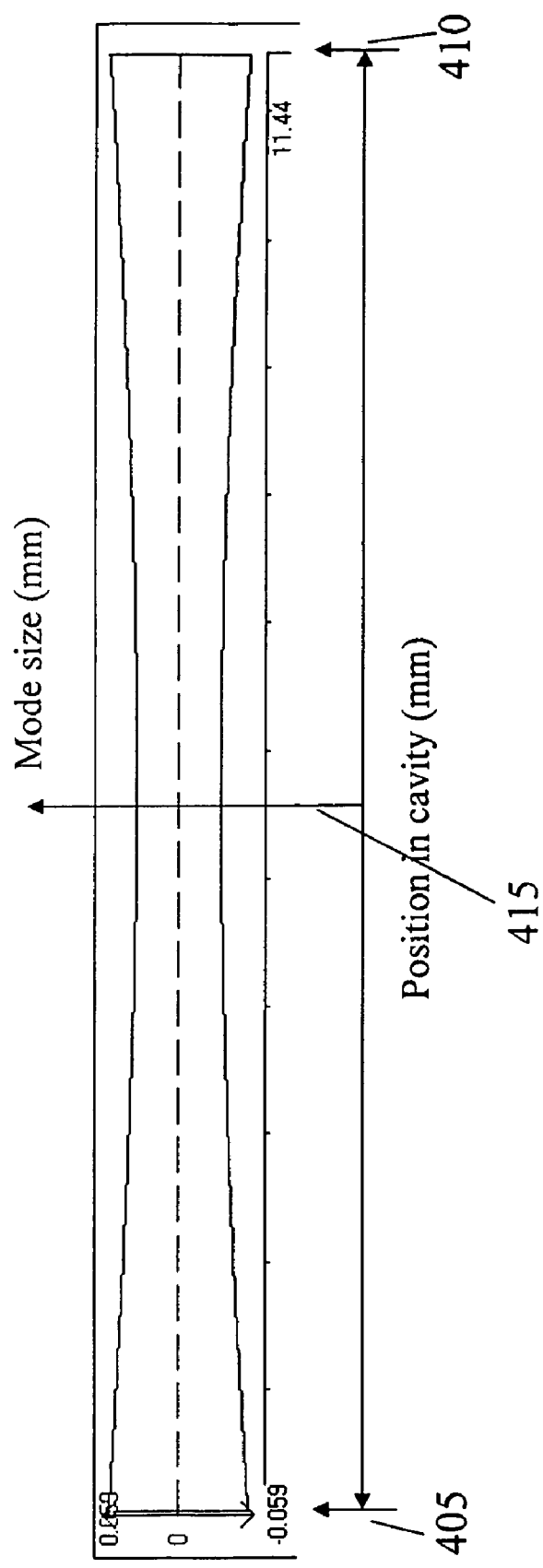
FIG. 4 illustrates transverse mode size versus cavity position for a specific cavity design in accordance with one embodiment of the present invention.

FIG. 4 illustrates the computed size of the cavity Gaussian mode as a function of position within the cavity for a specific example. For this illustration the laser cavity has been "flattened", that is the optical path has been straightened to show the effective length of the cavity without the need to show the position of any turning mirrors or other components. In this example, each die has a 120 micron current limiting aperture. There is one die situated at each end of the cavity 405, 410. The fundamental wavelength in this example is 930 nm. Each die has a thermal lens of 9 mm effective focal length induced by the drive current. The beam diameter on the die is 118 microns, which matches well with the 120 micron current aperture. The mode diameter is large enough to efficiently extract energy from an indirectly pumped region surrounding the current limiting aperture. The beam diameter at the center of the nonlinear crystal (which can be located at the optical center of the cavity, 415) is 72 microns. The cavity performance is not interferometrically sensitive to cavity length. The effective cavity optical length is 11.4 mm although the physical cavity length is longer since the harmonic converter has a refractive index of about 2.16. The corresponding geometrical cavity length will be longer, $L_{geom}=L_{eff}+L_{crystal}((n-1)/n)$ with the geometrical cavity length for a 5 mm MgO:PPLN harmonic converter being ~14.1 mm. In this design example, when applied to the laser cavity shown in FIG. 2, the spacing between each die and its respective turning mirror is in the range of 1-to-4 mm and the spacing between the turning mirrors is in the range of 6-to-12 mm.

The serial architecture laser emitter cavity illustrated in FIG. 4 with two dies has approximately twice the cavity length of a single emitter cavity fabricated using a single die. That is, a comparable single emitter cavity design would have a flat mirror placed approximately at the mid-point of FIG. 4, 415. Thus, for a given length of harmonic converter the serial architecture laser cavity offers a more optimized location for the converter since the converter may be placed symmetrically around the minimum mode size in the cavity, which maximizes the nonlinear conversion efficiency for a given circulating laser power. In the comparable single emitter laser cavity the harmonic converter cannot be located symmetrically about the waist of the cavity mode since the waist is effectively located at the position of the cavity mirror, thus decreasing the harmonic conversion efficiency compared to the serial architecture cavity. The longer cavity length afforded by the serial (2 die) architecture decreases the axial mode spacing of the optical cavity modes. This effect can be used, if desired, to favor multi-axial mode operation. Multi-axial mode operation is desirable in some display applications to reduce speckle. Consequently, in one embodiment the design parameters are selected such that the laser operates with multi-axial modes to reduce speckle. Multiple axial modes can also increase the efficiency of the frequency conversion process in the harmonic converter.

Exemplary component sizes for a serial architecture laser cavity as shown in FIG. 3 are as follows. An exemplary single-emitter die is 8-to-100 microns thick with an area of 1×1 mm. The harmonic converter may have a cross-section area of 0.5×1 mm with 3 to 10 mm physical length. The cavity turning mirrors may have a 2×2 mm cross-section with a thickness of 1 mm—the thickness of the mirror substrate can be chosen to ensure that the mirror surface is accurately flat to prevent distortions being introduced in to the optical mode within the cavity. The application of multilayer dielectric thin film coatings to these substrates can lead to the introduction of stresses and curvature of the substrate, which can be minimized by a combination of careful design of the coating, the application of matched stress-balancing coatings on both sides of the substrate and by annealing the coatings after deposition to relieve built-in stresses.

The optical output power of the single emitter die serial architecture has been empirically investigated and it has been determined that the power output scales approximately linearly with the number of VECSEL dies operated serially. For example, an embodiment of the present invention with two single emitter dies operated in a series architecture has demonstrated a two-fold improvement in output power as compared to that generated in a single-die cavity. This has been achieved at second harmonic wavelengths of 465 nm, 532 nm and ~615 nm. For example at a second harmonic wavelength of about 460 nm, a laser cavity incorporating a single emitter (single die) was tested to have an optical output power of 122 mW. A series architecture laser cavity (FIG. 2) incorporating two dies (two emitters) had an output power of 241 mW, which is very nearly a two-fold increase in output power compared to the conventional single die, single emitter design. The reason for this less than two fold power increase is likely non-optimized component losses in the external cavity.

Figure 5:
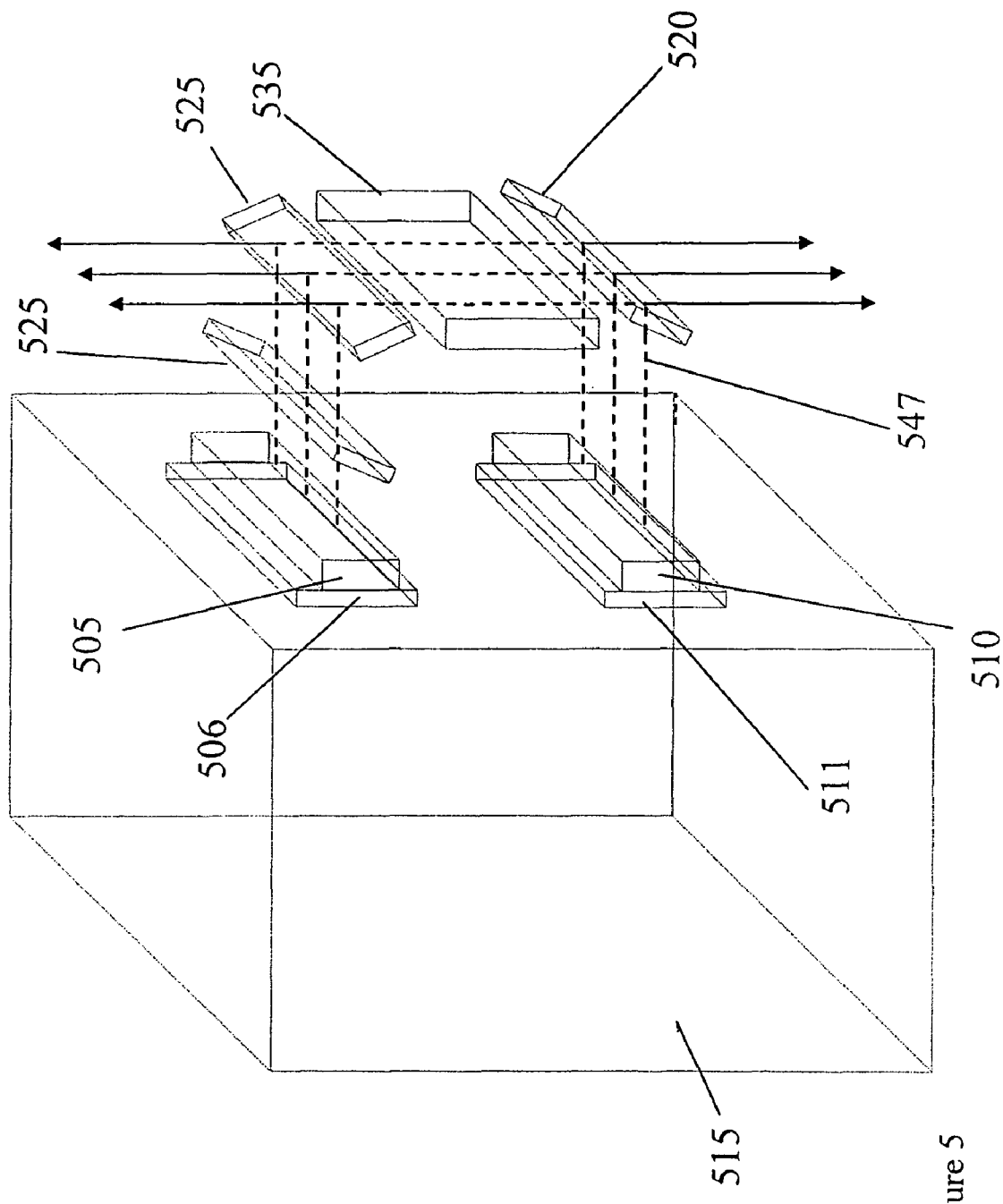
FIG. 5 is a perspective drawing of a cavity using two, 1-D arrays of VECSEL gain elements in accordance with one embodiment of the present invention.

It will be understood that the present two-die serial architecture laser cavity can be extended such that each die comprises an array of emitters. As a result, an array of lasers is formed in which each sub-laser in the array has two gain elements per laser. That is, the serial architecture includes a set of serial lasers operating in parallel. FIG. 5 is a perspective drawing showing two, 1-d arrays of VECSEL gain elements 505, 510 in a serial architecture. Certain components previously described are omitted for purposes of illustration, including the prism for single direction output. The two, monolithic 1-d arrays of VECSEL gain elements are mounted on a common submount or heatsink 515. The common submount/heatsink can be made of copper or some other high thermal conductivity material so that the waste heat generated in the array die during laser operation can be efficiently removed to maximize the laser performance. The array die may be directly mounted to the submount/heatsink using solder to provide efficient thermal and electrical connection. Alternatively, the array die may be mounted to a carrier, 506, 511, comprising for instance a ceramic material which may be chosen to provide close thermal expansion matching to the array die, while maintaining high thermal conductivity. Examples of such materials are BeO, (beryllium oxide) AlN (aluminum nitride) and copper plated AlN. The use of a thermal expansion matched carrier for the array die isolates the die from the potential deleterious effects of thermal cycling and stress and strain damage which may occur during operation if the dies are bonded directly to the submount/heatsink. The ceramic carrier may be fabricated with metalized surfaces such that soldering may be used to attach the array die to the carrier and the carrier to the submount. An example of this would be the use of gold-tin (e.g. 80-20 AuSn) solder to attach the array die to the carrier. This is a high temperature (>300° C.) soldering step which provides a very strong, reliable, thermally and electrically conductive bond. The carrier may then be bonded to the submount using a lower melting point solder such as indium, silver-tin or silver-copper-tin, which will also provide reliable mechanical, electrical and thermal bonding between the carrier and submount without disturbing the array die to carrier bond.

In one implementation, the array die are 3 to 10 mm long and individual gain elements on each array are nominally identical (that is, they are made to the same design and any variations between emitters are due to wafer growth and process variations across the dimensions of the die). Current VECSEL fabrication techniques permit the placement of 10-to-50 gain elements on each monolithic array die.

The serial architecture array laser cavity also comprises two turning mirrors 520, 525, a spectral filter 530 and a harmonic converter 535, which can extend across the full width of the array die such that only one set of these components forms all the parallel laser cavities in the array. A typical fundamental beam path in the extended cavity is shown by 547. An optical prism (not shown) placed outside the laser cavity (extra cavity) can be included to redirect one set of output beams to provide substantially unidirectional optical output from the laser array device. It should be noted that as the size of the array increases in the lateral direction, the surface flatness specifications required of the components in the laser cavity are increased. That is, in order to maintain laser performance and efficiency across all the emitters in the array, the flatness of the mounted array and the intracavity turning mirrors must be maintained to a tight tolerance. For a given array flatness curvature or mirror curvature the angular misalignment of the optical cavity for a pair of emitters increases with the distance between the emitter location and the center of curvature, thus as the array becomes larger the potential for losses due to cavity misalignments increases. Preferably the array die is mounted to the carrier/submount with a flatness/curvature of less than 3 microns over 10 mm. Additionally, the curvature of the optical surfaces within the laser cavity (e.g. the planar turning mirrors and the polished surfaces of the harmonic converter) is less than one micron over 10 mm. For this reason, the thickness of the mirror substrate can be chosen to ensure that the mirror surface is accurately flat to prevent distortions being introduced in to the optical mode within the cavity. The application of multilayer dielectric thin film coatings to these substrates can lead to the introduction of stresses and curvature of the substrate, which can be minimized by a combination of careful design of the coating, the application of matched stress coatings on both sides of the substrate and by annealing the coatings after deposition to relieve in-built stresses.

The output power of the series-architecture laser array scales with the number of laser cavities that operate in parallel.

Figure 1:
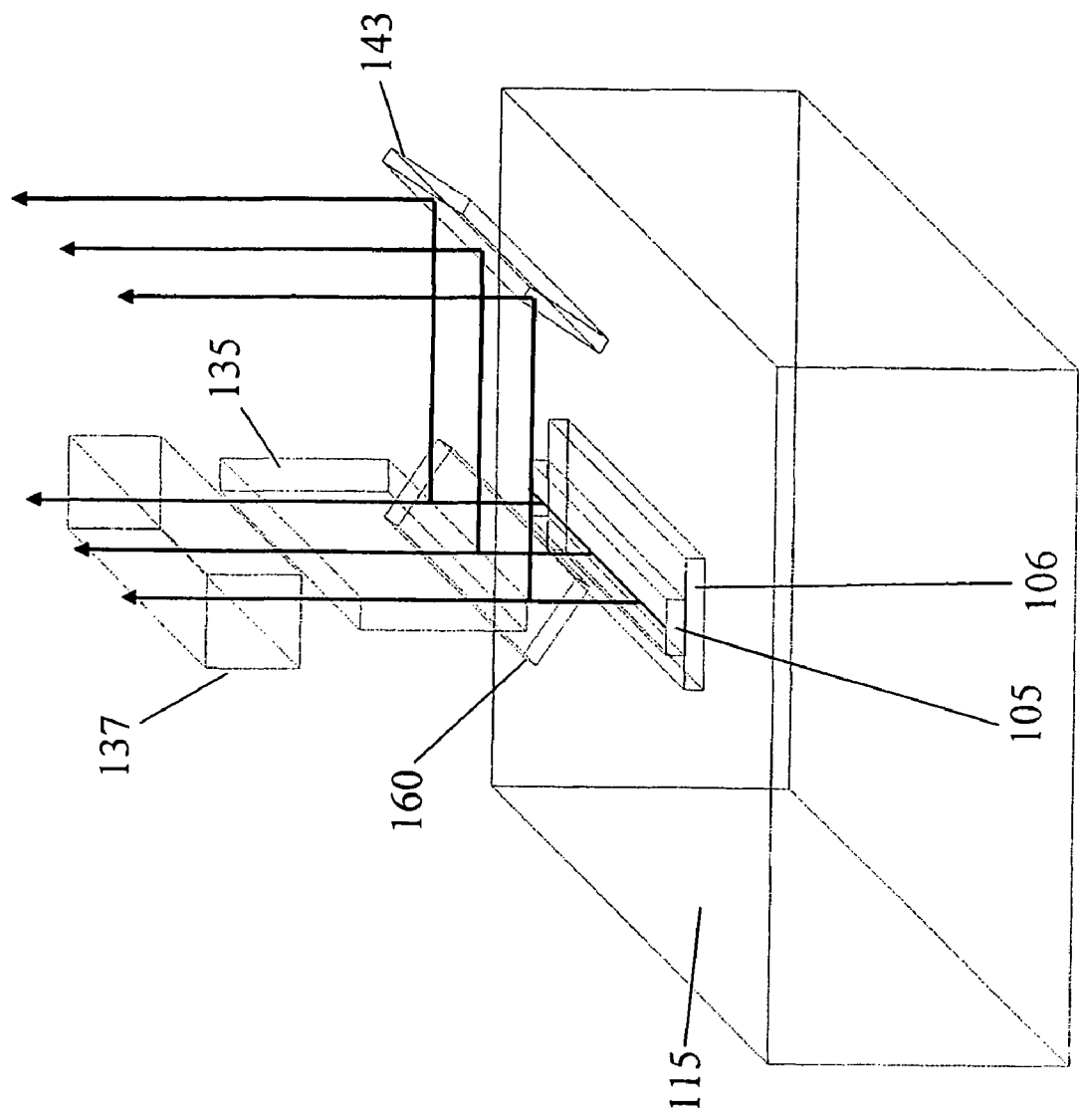
FIG. 1 illustrates a prior art laser system comprising an array of surface emitters arranged in a parallel fashion.

In assessing the improvement in performance of the above described embodiment of a laser system comprising a parallel array of serial architecture laser cavities it is instructive to consider in detail the optical components in the extended cavity and their effects. We can compare the optical components illustrated in FIG. 5 with their counterparts in the single emitter based cavity shown in FIG. 1. The optical components forming the laser cavity in the present embodiment are; the two array die 505, 510, two turning mirrors 520, 525 (at least one of which can act as a polarizer for the fundamental light), one harmonic converter crystal 535 and one spectral filter 530, a total of 6 components. In FIG. 1 the optical components comprising a single emitter based cavity are; the array die 105, a combined beamsplitter/polarizer 160, a harmonic converter crystal 135 and a volume Bragg grating 137, a total of 4 components. We can readily see that the number of optical components per gain region has decreased, from 4 to 3 when moving to the architecture of the present invention. In addition, the complicated and lossey (to the visible) volume Bragg grating has been replaced, such as by a thin film spectral filter, and only a single harmonic converter crystal is required, significantly reducing the cost per watt of output power as these (the VBG and harmonic converter) are both relatively expensive components. Since the number of components has been decreased, the number of optical surfaces that are present in the cavity has also been decreased (per gain region). Therefore the extended cavity losses (per gain region) have also been decreased. Thus for a given electrical pumping level, the present embodiment of the serial architecture can be expected to provide a higher output power and efficiency than the combined output of two prior art systems based on the cavity of FIG. 1.

This greater than 2-fold increase in power is achieved with the present invention. Two array die which generated a summed total of ~8.2 watts of visible power when assembled (individually) into a cavity based on FIG. 1 (the cavity length and alignment was optimized under computer control in order to determine the maximum possible output power) yielded ~9.3 watts of visible power when assembled into the cavity of FIG. 5 of the present embodiment. This represents an ~2.27 fold improvement over the single emitter cavity based performance and demonstrates the significant improvement in laser performance that is possible due to the present invention combination of multiple VECSEL gain elements in a single series laser cavity, and the accompanying reduction in optical components and extended cavity losses.

It should be noted that in an external cavity frequency doubled laser of the type illustrated in FIGS. 3 and 5 can be used to optimize the extended cavity performance for the infra-red fundamental wavelength rather than the second harmonic (SH). In other words, the output power in both the fundamental and SH is more sensitive to small changes in loss at the fundamental that at the SH. Since generally, high quality highly reflecting coatings are easier to fabricate than ultra-low loss anti reflection coatings, the incorporation of the two front surface turning mirrors 520, 525 and the reduction in number of optical surfaces (per gain region) through which the fundamental is transmitted, makes it easier to optimize the cavity performance for the fundamental, therefore maximizing the intracavity power and maximizing the amount of second harmonic that can be generated. In addition, the elimination of the volume Bragg grating used in the prior art single emitter based cavity improves the achievable visible output power since the VBG typically scatters 10-20% of the visible light that passes through it, causing an overall loss of 5-10% of the visible output power from the prior art device. In the present invention as shown in FIGS. 3 and 5, the visible output from the laser is extracted through the turning mirrors 520, 525. This arrangement significantly reduces the losses in the visible as compared to the VBG based cavity as a dichroic mirror with the combination of high quality HR at the fundamental wavelength coupled with high (99%+) transmissivity at the second harmonic is readily achievable using thin film coating techniques known in the art, such as ion beam deposition. Thus in the laser cavity of the present invention the cavity losses at both the fundamental and second harmonic wavelengths are reduced compared to the prior art, thus providing improved output power and efficiency for the serial architecture laser system.

It should be noted that since the serial architecture of the present invention provides two gain elements per serial laser cavity, and the power output from each serial laser cavity may be a factor of two or more larger than that from a single emitter based array, FIG. 1, for a given amount of output power each array die need only contain half as many gain regions. Therefore for a given output power the linear dimensions of the array die may be halved compared to the prior art dimensions of FIG. 1. Alternatively, considering the mechanical handling, thermal expansion and array die curvature effects discussed above as limiting the array size that can practically be packaged into an operating device, the present invention enables at least an increase of a factor of two in possible output power from an optimum laser system.

Figure 6:
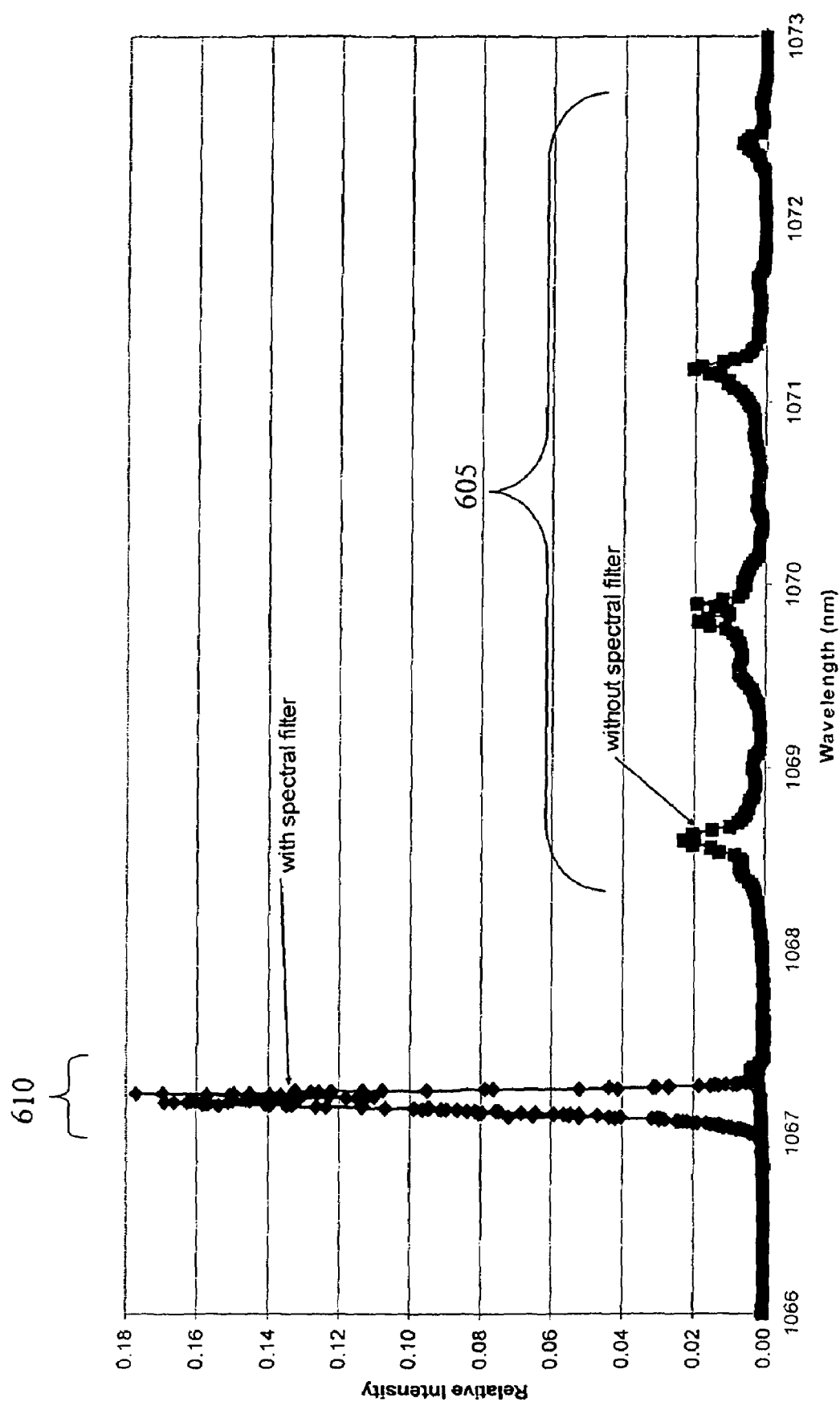
FIG. 6 illustrates the average spectrum of the circulating fundamental radiation in 23 laser cavities using 46 VECSEL gain elements with and without a spectral filter in accordance with one embodiment of the present invention.

FIG. 6 illustrates the average spectrum of the circulating fundamental (infra-red) radiation in 23 laser cavities using 46 VECSEL gain elements with and without a spectral filter. Without the spectral filter the infra-red spectrum 605 is multi-peaked and spread over several nanometers (nm). The spectrum without the spectral filter is unsuitable for harmonic generation since the harmonic converter spectral acceptance for PPLN is in the range of 0.2 to 1.2 nm depending on the harmonic wavelength and the PPLN crystal length. The infra-red spectrum 610 with the spectral filter is sharply peaked with full width at half maximum of approximately 0.1 nm, which is well within the spectral acceptance bandwidth of a PPLN harmonic converter. Thus, an embodiment of the present invention that includes a spectral filter enables high efficiency harmonic generation. The spectral filter may for example be a Fabry Perot etalon that provides high transmission for only a certain desired wavelength and spectral bandwidth. Such a Fabry-Perot etalon may be fabricated using thin film coating techniques as known in the art, similar to those used to create "notch" filters for telecommunications devices.

Figure 7:
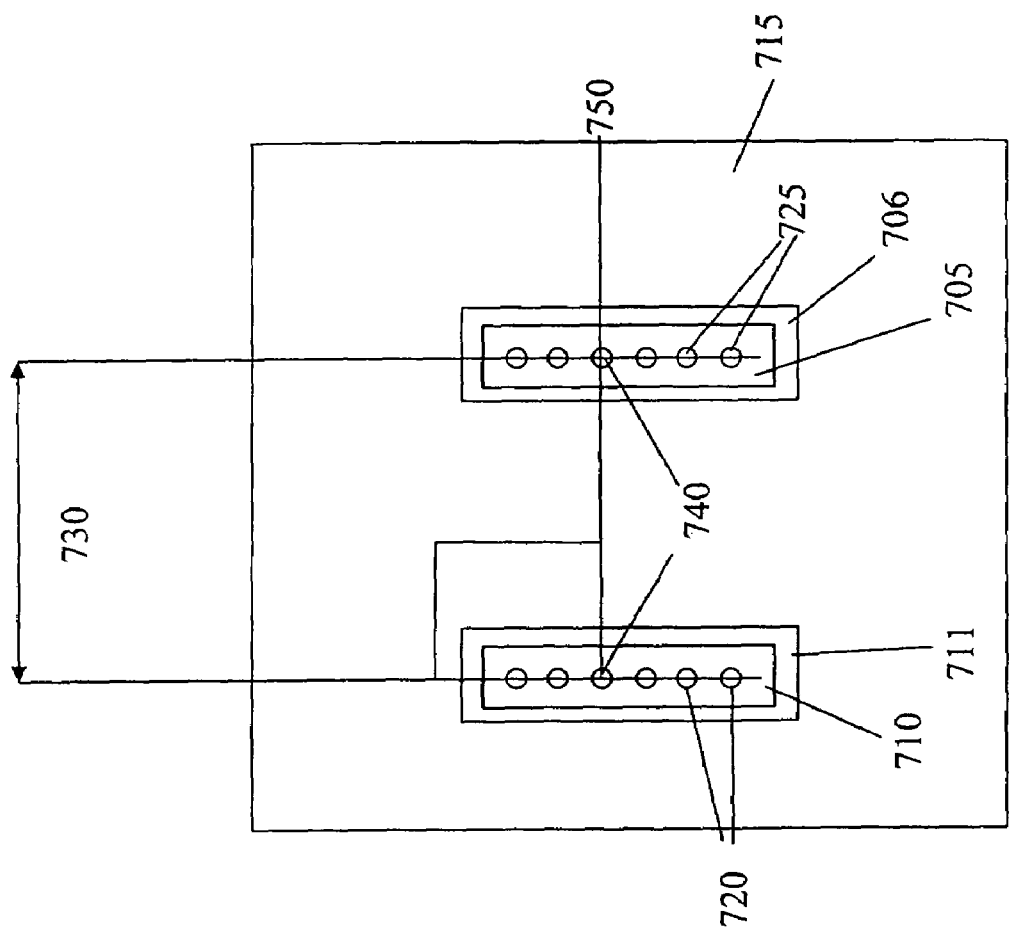
FIG. 7 illustrates the alignment required between two 1-D array die in an embodiment of the present invention

In order to provide efficient operation of the 2-die parallel-array serial architecture of FIG. 5 it is necessary to provide accurate relative alignment of the two array die 705, 710 on the submount 715 as shown in FIG. 7. Preferably the lateral distance 730 between the centers of the gain regions 720, 725 on each die remains constant over the full width of the die, i.e.

there is no angular misalignment between the die along their long axes. The maximum displacement of the center of any gain region from this parallel alignment is less than 10 microns, and preferably is less than 5 microns. Additionally, the two dies can be aligned such that the centers of any two paired gain regions, 740 (i.e. the two gain regions that form any one of the series architecture laser cavities) fall on a line 750 that is perpendicular to the long axes of the array dies. The maximum displacement of the center of any gain region from this perpendicular alignment is less than 10 microns, and preferably less than 5 microns. These alignments ensure that the light emitted from either die can be efficiently reflected towards the other using simple planar cavity turning mirrors aligned parallel to the long axes of the arrays simultaneously for all the emitting apertures on the dies. It should be noted that the magnitude of the allowable misalignments described above are dependent on the dimensions of the gain regions formed on the array die. As the gain region dimensions are decreased, the allowable misalignment will also generally be decreased as a given dimensional misalignment will represent a larger proportion of the gain region and therefore cause a larger optical misalignment loss. This alignment is difficult to achieve, but can be accomplished using state of the art die bonding equipment. The accurate alignment of the two array die mounted on ceramic carriers during the bonding process to the submount/heatsink is complicated by the difficulty of fabricating accurate alignment marks on the submount, but can be accomplished by existing techniques within the tolerances described above.

In an alternate embodiment, the two array die are bonded to a single ceramic carrier piece. Since the metallization layers created on the ceramic carrier to accomplish the solder bonding of the array die are photolithographically patterned it is simple to add accurately positioned, photolithographically defined alignment marks that can be used to reference the absolute and relative positions of the two array die on the carrier. In this way, optical alignment processes can be used to accurately place both array dies prior to soldering to the carrier (e.g. with AuSn solder)—the optical alignment processes are able to use lithographically defined alignment marks on the array die, and those on the carrier to provide precise positioning of the die. This is helped by the thinness of the die (less than approximately 100 microns) which means that parallax errors induced in the optical alignment system when viewing the alignment features on the die and the carrier are minimized. A disadvantage of this single ceramic carrier approach is that the ceramic carrier becomes significantly larger as it must span the gap between the two array die, thus potentially increasing the carrier cost significantly.

Figure 8:
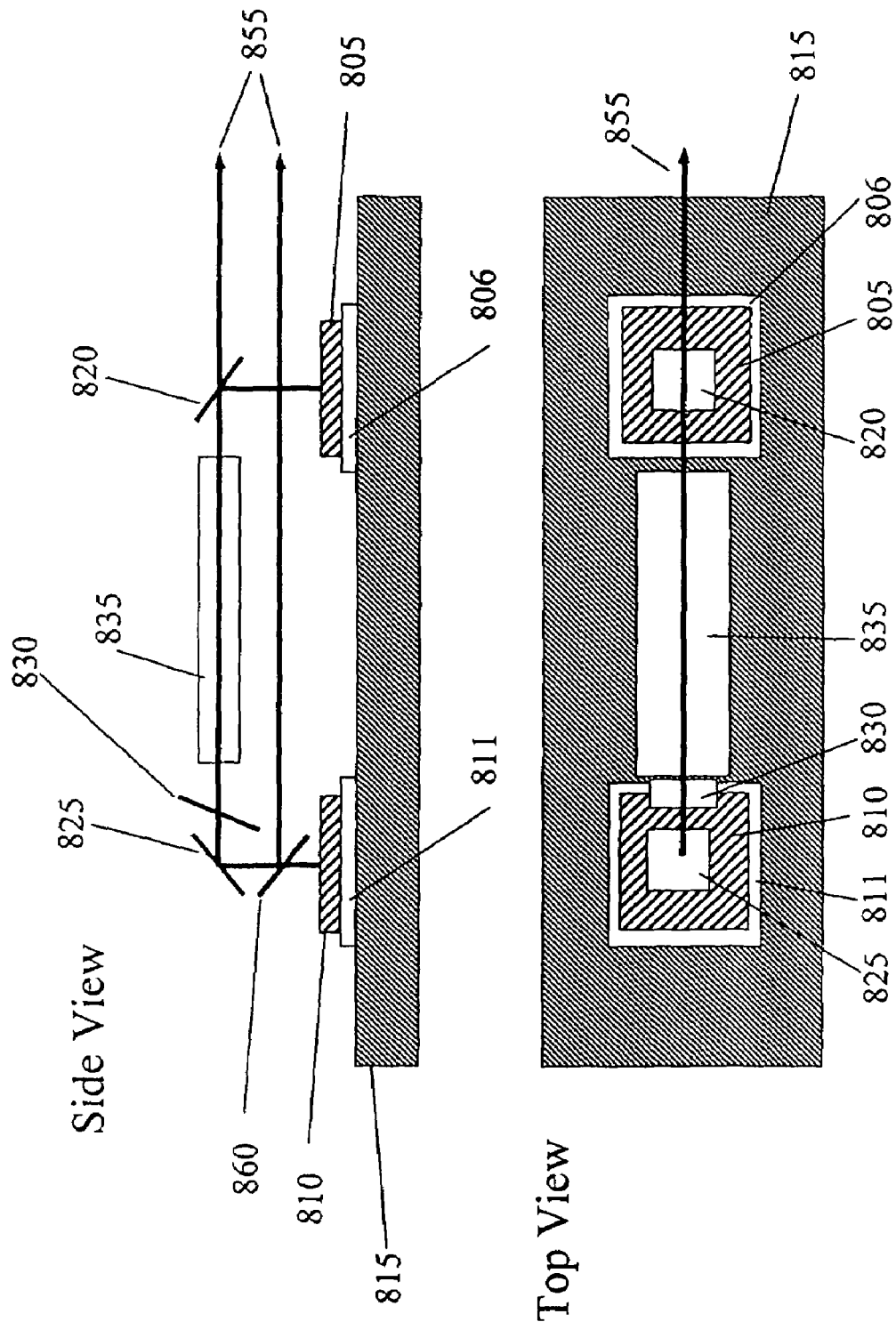
FIG. 8 illustrates an alternative embodiment using a coated optical window at an oblique angle of incidence as an intracavity polarizer.

A variety of alternate embodiments are contemplated as being within the scope of the present invention. For instance, variations on the technique used to provide polarization control may be applied. In one embodiment elements other than the turning mirrors are used to polarize the fundamental cavity output. For example, a separate polarizing element 860 consisting of a window with polarizing dielectric coating may be used, as illustrated in FIG. 8. The separate polarizing element can also be coated to pick off the second harmonic beam with the turning mirror 825 adjacent to the polarizer 860 chosen to be a high reflector for the second harmonic beam. (i.e. one side of the polarizing element substrate is coated with a thin film coating providing a polarization selective transmission for the infra-red (fundamental) wavelength and an anti-reflection coating for the second harmonic, while the other side of the substrate is coated with an anti-reflection coating for the infra red and a highly reflective coating for the second harmonic beam. All of these thin film coatings can be fabricated using techniques known in the art, such as Ion Beam Sputtering.) Other examples of variations on the technique used to provide polarization control include placing the polarizer in other legs of the cavity; not using the polarizer as a second harmonic pickoff element; and using a wedge shaped harmonic converter which causes the cavity to be aligned for only one polarization.

It will be understood that the optics used to redirect the second harmonic beams to a single output direction may by achieved in a variety of different ways. For example, it is possible to use extra cavity elements such as a prism retroreflector to redirect the second harmonic beams into a single direction output. Additionally, the prism can be replaced with two mirrors.

Figure 9:
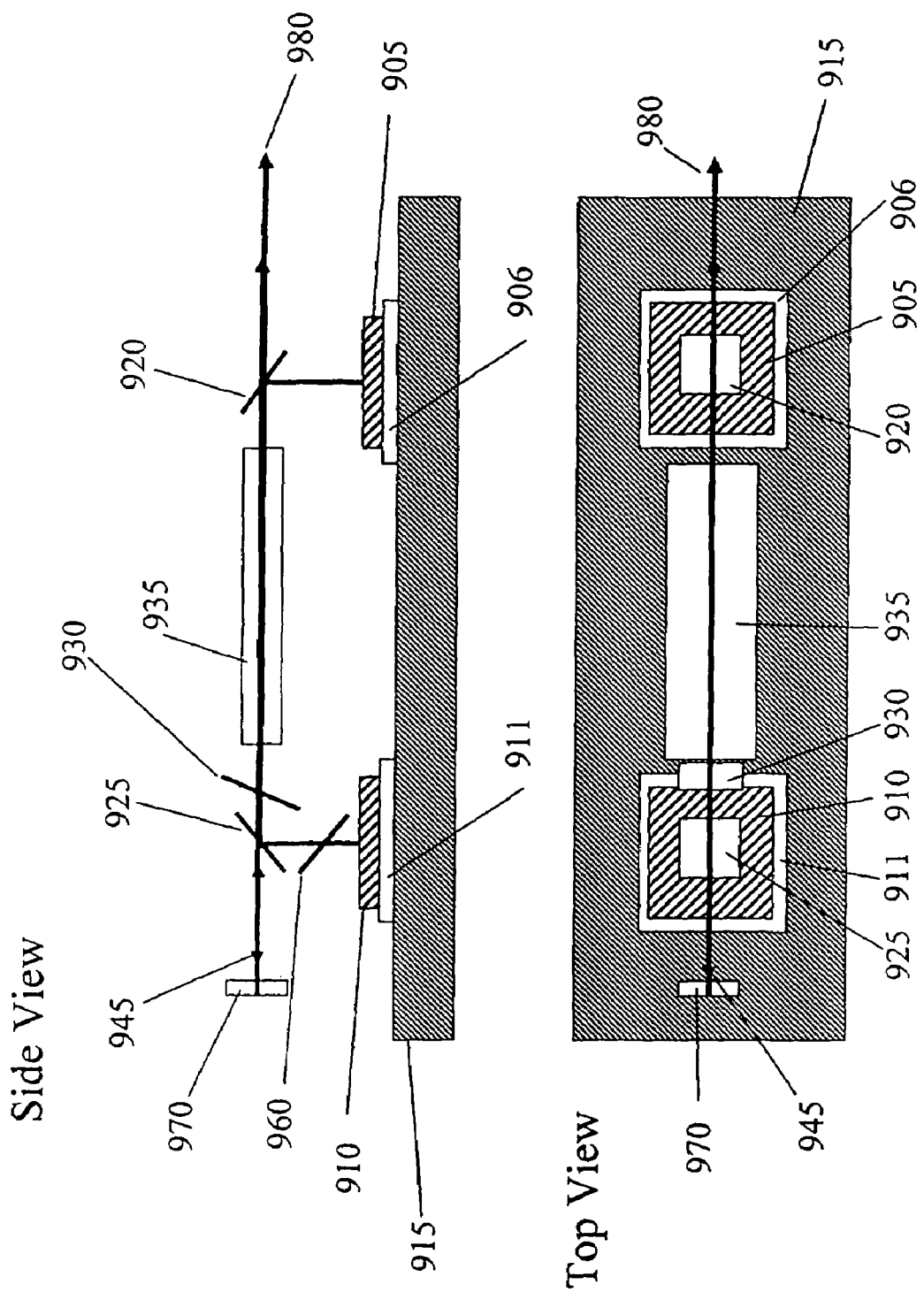
FIG. 9 illustrates an alternative embodiment with waveplate allowing single ended output without interference between counter propagating second harmonic beams.

As illustrated in FIG. 9, in one alternate embodiment, a waveplate 970 is used to rotate the polarization of the reverse directed second harmonic beam 945 allowing single ended output without interference between second harmonic beams. Both cavity turning mirrors 920, 925 are dichroic with high reflectivity at the fundamental wavelength, but anti-reflection (AR) coated for both s- and p-polarizations of the second harmonic wavelength. The reverse directed second harmonic light passes through mirror 925. The front side of the waveplate 970 is AR coated for the second harmonic. The second harmonic beam is retro-reflected back on itself by a high reflectivity (HR) coating on the rear side of the waveplate. In two passes through the waveplate, the polarization of the retro-reflected second harmonic beam experiences a 90 degree rotation so that the output polarization is orthogonal to the input polarization. The retro-reflected, reverse directed beam then passes back through mirror 925, the harmonic converter 935, and mirror 920 since all these components are AR coated for this wavelength and polarization. Due to the 90 degree rotation, the retro-reflected beam can be re-directed to be coincident with the forward directed second harmonic beam. That is, the retro-reflected reverse directed beam does not interfere with the forward directed second harmonic beam because the beams have orthogonal polarizations. An advantage of this embodiment is that the output of each laser is essentially a single beam, and therefore the cumulative output of the array of lasers is substantially oriented in a single direction 980, which facilitates integration into projection display systems and other applications. Note that in one embodiment the polarizer in FIG. 9 may be an uncoated piece of glass, for instance incorporated into the cavity aligned at the Brewster angle for the infra-red light.

Figure 10:
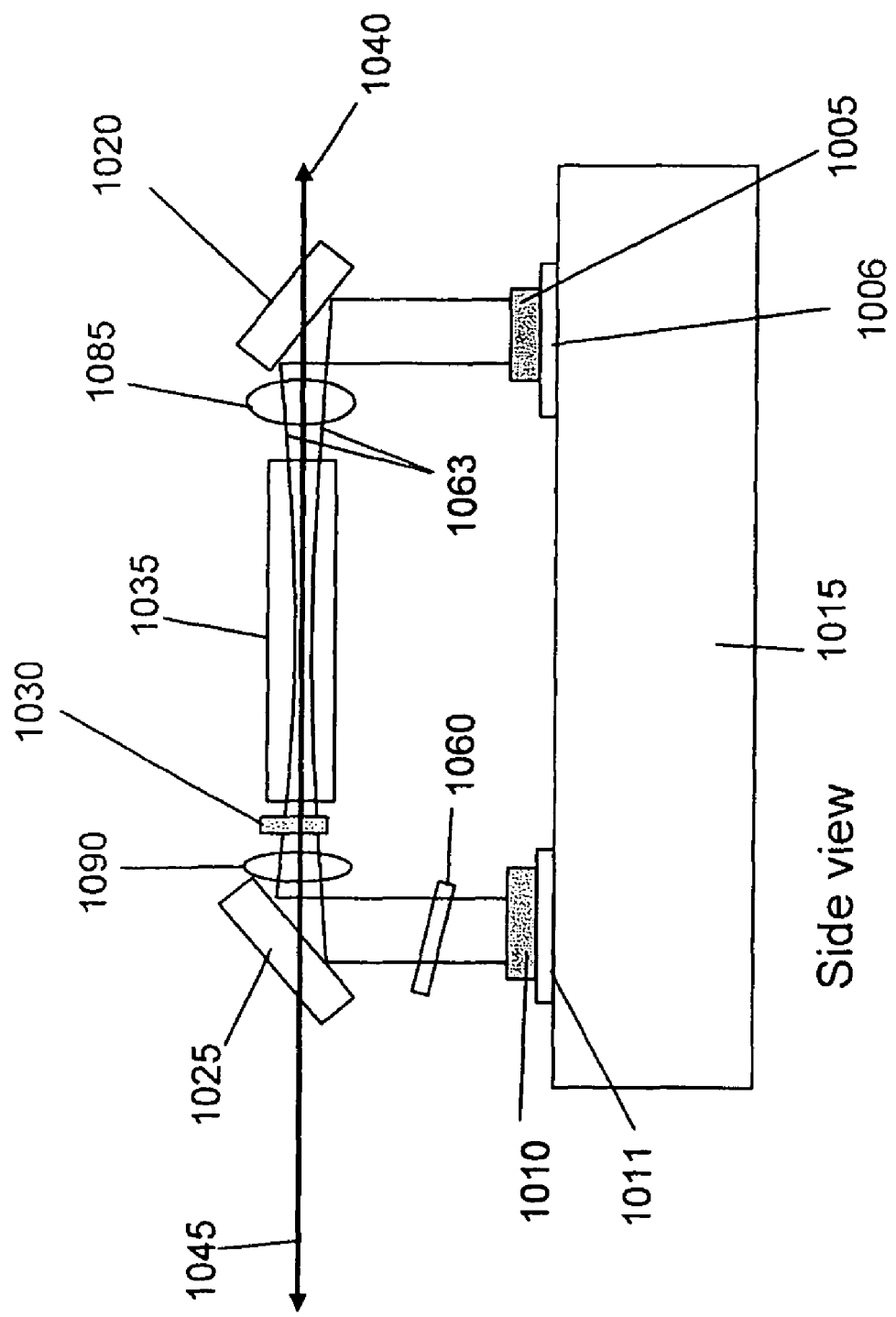
FIG. 10 illustrates an alternative embodiment with the incorporation of additional focusing elements with the laser cavity

In the embodiments described above the parallel array of serial-architecture laser cavities have been described using planar mirrors, with the only intracavity focusing element being the thermal lens generated in the laser die by the electrical drive current. An alternative embodiment is shown in FIG. 10 where lenses 1085, 1090 are added into the cavity to provide a focusing effect on the infra-red laser cavity mode shown schematically by 1063. The addition of intracavity lenses enables the optimization of the spot size within the harmonic converter, and therefore optical intensity and harmonic conversion efficiency, independent of the gain region emitting aperture and the thermal lensing induced by the electrical drive current. In this way the laser cavity designer is provided with more degrees of freedom to optimize the laser design for maximum output power and efficiency as the properties of the optical modes of the laser cavity may be independently optimized in different regions of the cavity. The lenses 1085, 1090 may take the form of cylindrical lenses which have uniform cross section over the entire width of the array and therefore provide a focusing action only in one plane. Alternatively the lenses may take the form of lens-arrays, where individual lens-lets fabricated on a common substrate are aligned to each emitter pair in a series architecture to provide focusing in two dimensions. Such lens arrays may be fabricated by photolithographic techniques which are ideally compatible with maintaining accurate alignment of lens spacing to the lithographically defined emitter locations. Note that although two lenses are shown in FIG. 10, one on each side of the harmonic converter, it is not necessary that the two lenses 1085, 1090 are identical in terms of focal length. In fact it is not necessary that both lenses are present and some embodiments may have only a single lens added to the cavity, while other embodiments may use three or more lenses. Additionally, although the lenses 1085, 1090 are shown placed between the turning mirrors 1020, 1025 and the harmonic converter 1035, they may equally be placed between the dies 1005, 1010 and the turning mirrors. In fact, the lenses may even be fabricated onto the die themselves using surface etching techniques known in the art to lithographically pattern the lens array. In general it is expected that the additional intracavity lenses would be convex or positive focusing lenses, however it is possible that in some designs the optimum cavity mode sizes may be obtained by the incorporation of concave or negative (diverging) lens elements.

In an alternative embodiment the focusing action of the intracavity lenses of FIG. 10 may be achieved using curved mirrors in place of the plane mirrors. Again, the curved mirrors may have uniform cross section over the width of the array to provide focusing only in one dimension, or the mirror surface may be patterned to provide a two dimensionally curved mirror surface aligned to each emitter pair in a series architecture to provide focusing in two dimensions.

In other embodiments of the parallel array series-architecture the gain regions fabricated on the array die need not be identical on the two die. The gain regions may vary in size, e.g. diameter, and/or shape, e.g. circular on one die and oval or elliptical on the other die. This size/shape variation may be combined with the additional intracavity focusing elements described above to optimize the laser output power by optimizing the overlap of the laser cavity mode with the gain region. For instance, in embodiments where the intracavity focusing elements only provide focusing in one dimension the gain areas can be formed on at least one of the two dies ovally or elliptically shaped, to maximize the gain area that can be utilized by the lowest order (TEM00) Gaussian mode of the cavity, and thus maximize the output power that can be generated by the laser.

Figure 11:
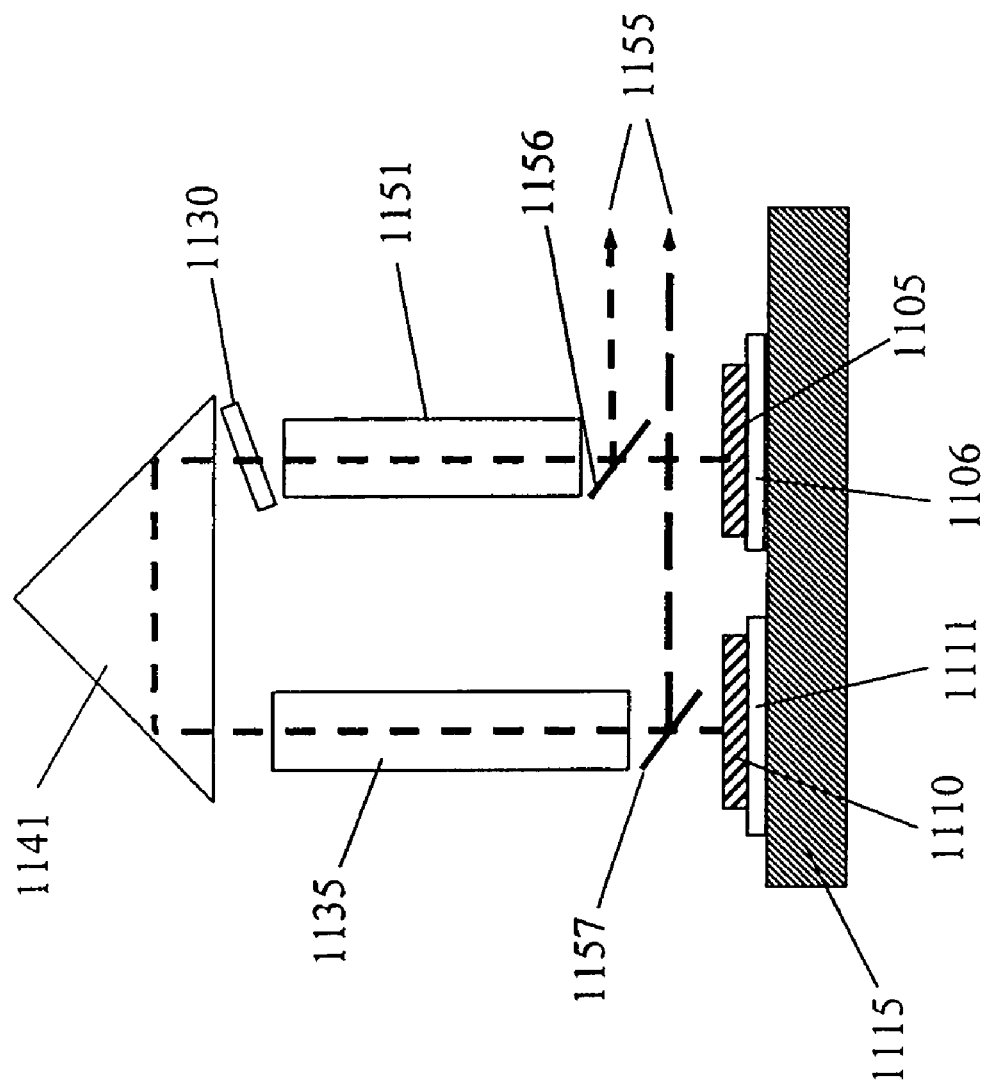
FIG. 11 illustrates an alternative embodiment with a different arrangement of optical cavity components

In an alternative embodiment of the present invention as shown in FIG. 11, the relative orientations of the laser cavity components are changed to alter the layout of the cavity. In this embodiment the two VECSEL dies 1105, 1110, which may be single emitter or array die, are bonded to carriers 1106, 1111 and then to a common submount/heatsink 1115. The harmonic converter 1135 is fixed in position with its optical axis substantially perpendicular to the VECSEL die surface. A heating mechanism (not shown) is provided to control the temperature of the harmonic converter to ensure that the phasematching condition is achieved for efficient harmonic conversion. Light emitted from the VECSEL die is directed through the harmonic converter and then redirected towards the second VECSEL die by the prism 1141 which preferably provides a "corner-cube" reflection such that the path of the light exiting the prism is parallel to the path of the input light, creating a U-shaped cavity. Depending on the prism material, the reflection may utilize total internal reflection or may be achieved by the use of thin film coatings on the surfaces of the prism. Alternatively the beam could be redirected using two turning mirrors as used in the cavity previously described in FIG. 3, but an advantage of the right angle roof prism is a reduced alignment complexity. Since the parallelism of the reflected beam is set by the accurately polished angle of the prism the alignment of the prism may be reduced to adjusting the position of the prism above the dies and submount, that is the separation distance between the base of the prism and the submount. Adjusting this distance adjusts the lateral separation of the incident and redirected beams from the prism so that the redirected beam is aligned to the gain region of the second VECSEL die.

Optionally an optically transparent high refractive index material component 1151 may be added in the path of the optical beam in the cavity. This high index material serves to reduce the effective optical length of the cavity compared to the physical length and can therefore be used to control and optimize the cavity mode beam profiles.

Optically coated beam splitters 1156, 1157 are incorporated into the two "legs" of the cavity to "pick off" or direct the generated second harmonic light efficiently out of the cavity. These components can be HR coated for the second harmonic wavelength while being AR coated for the fundamental wavelength. As described previously, one or both of these beam splitters may also serve the purpose of providing polarization selectivity at the fundamental wavelength in order to ensure that the laser runs in a stable, highly polarized mode. A spectral filter 1130 can be incorporated into the cavity in order to control the wavelength spectrum of the fundamental mode so that the laser wavelength is locked to a particular value and the bandwidth controlled to be within the phasematching bandwidth of the harmonic converter. Note that it is possible to combine the spectral filter component 1130 with one of the other components in the cavity, such as the high index material 1151 or the harmonic converter 1135, by applying the thin film coating comprising the spectral filter to one end of the high index material. This is desirable to reduce the total parts count in the cavity and thus reduce both the optical losses in the cavity to maximize the laser performance, and decrease the cost of the overall laser device.

In the FIG. 11 embodiment the harmonic converter 1135 is not placed at the optical center of the laser cavity and other focusing elements, including but not limited to lenses and the like, can be incorporated into the laser cavity in order to be able to optimize the spot size in the harmonic converter for maximum conversion efficiency, independently of optimizing the spot size at the VECSEL die for maximum infra-red laser performance.

Figure 12:
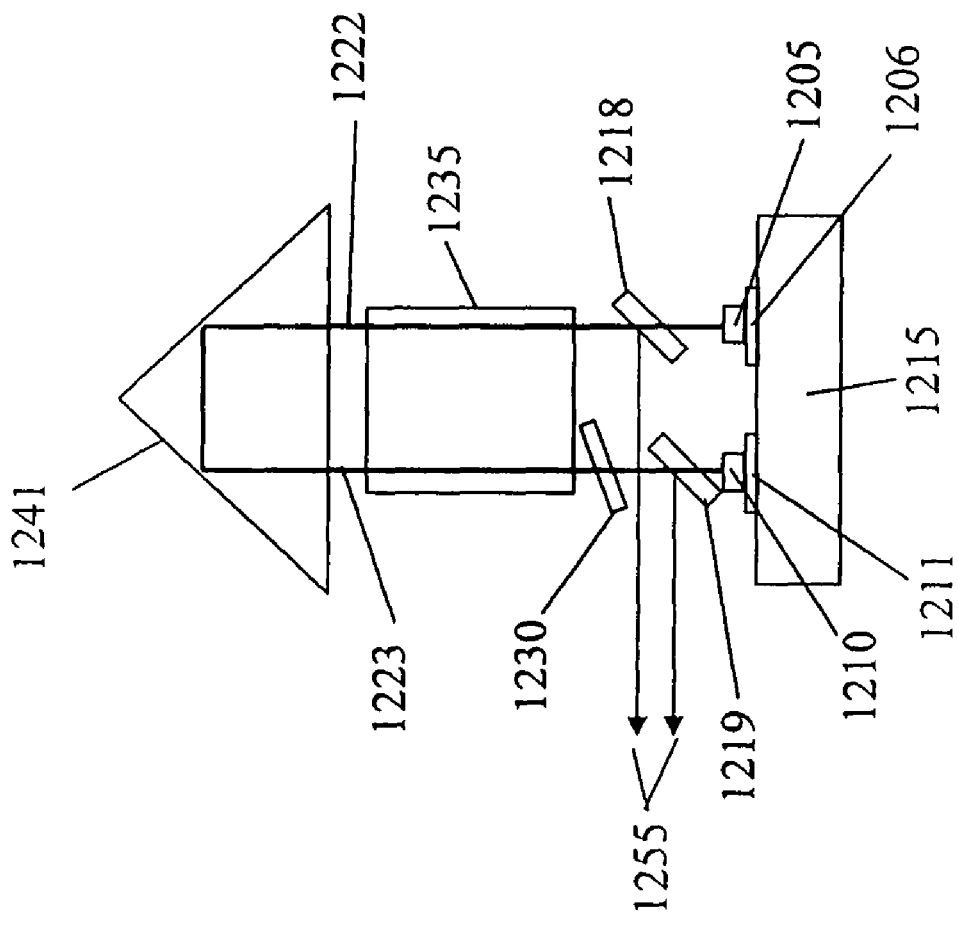
FIG. 12 illustrates an alternative embodiment with two emitters facing each other.

A further embodiment of the present invention is shown in FIG. 12. In this embodiment the harmonic converter 1235 extends into both legs 1222, 1223 of the cavity. In this way the fundamental light passes through the length of the harmonic converter 4 times in one round trip of the cavity, rather than the twice that occurs in the previously described embodiments. Preferably in this embodiment means (not shown) is provided to ensure that the fundamental and second harmonic beams traveling within the cavity are correctly phased whenever they enter the harmonic converter. If this is achieved the harmonic conversion efficiency is increased as the second harmonic generated in multiple passes through the converter is added in phase. The second harmonic is coupled out of the cavity using the two beam splitters 1218, 1219, which can be coated to be highly reflective at the second harmonic wavelength and highly transmissive for at least one polarization of the fundamental wavelength.

Figure 13:
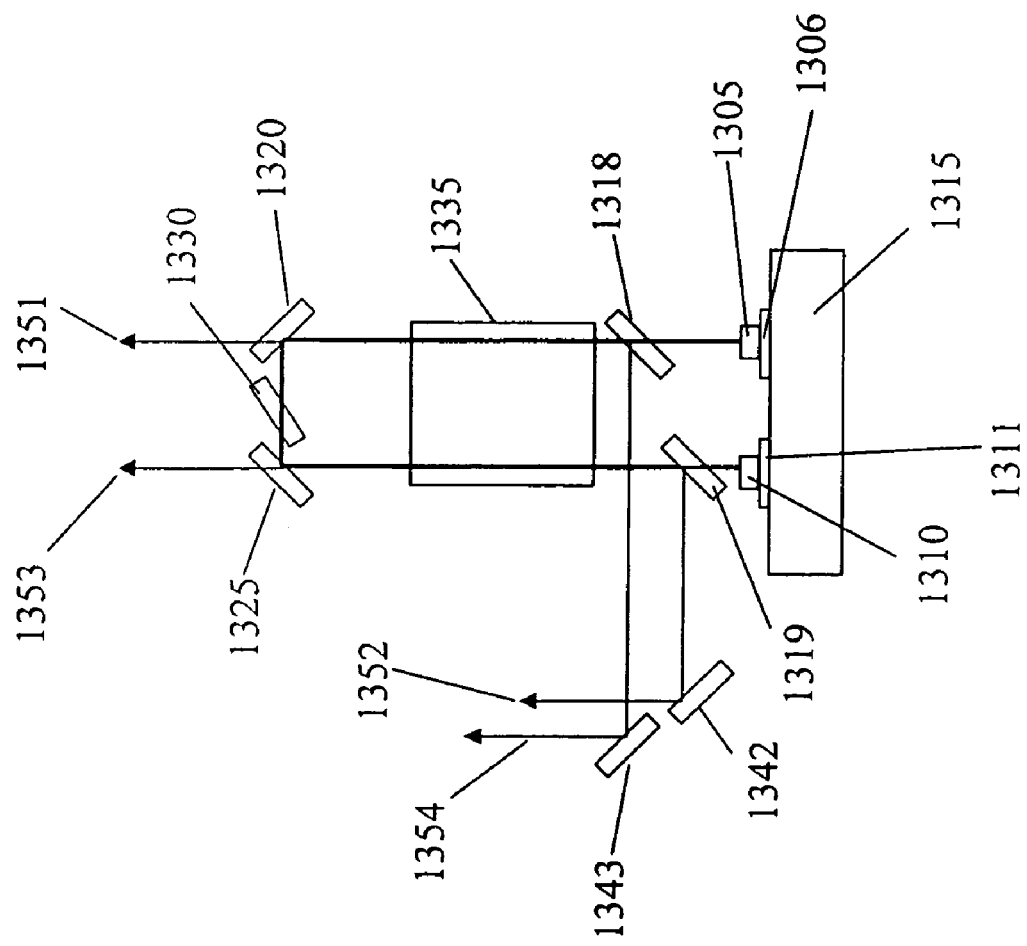
FIG. 13 illustrates an alternative embodiment with two emitters perpendicular to each other.

An alternative embodiment of the present invention is shown in FIG. 13. In this embodiment the fundamental light still passes through the length of the harmonic converter 4 times per round trip, but in this case the generated second harmonic light is coupled out of the cavity is 4 places eliminating the need to provide controlled phasing of the fundamental and second harmonic beams each time they enter the converter. Fundamental light exiting die 1305 enters the harmonic converter 1335 and generates second harmonic light. The residual fundamental and the second harmonic are incident on turning mirror 1320 which is coated to be highly reflective at the fundamental and highly transmissive at the second harmonic. At this point the generated second harmonic is coupled out of the cavity as beam 1351 through the turning mirror 1320. The residual fundamental is redirected to mirror 1325, which is also coated to be HR at the fundamental and HT at the second harmonic, and is redirected towards die 1310. The fundamental light enters the harmonic converter for a second time and generates second harmonic light. On exiting the harmonic converter the fundamental and second harmonic beams are incident on beam splitter 1319 which is coated to be HR at the second harmonic and HT at the fundamental. Thus the second harmonic is coupled out of the cavity as beam 1352 and the fundamental continues to be incident on die 1310 where it is amplified and retroreflected by the VECSEL emitter. Exiting the die, the fundamental light passes through beam splitter 1319 and enters the harmonic converter for a third time, generating second harmonic light, which is coupled out of the cavity as beam 1353 at turning mirror 1325 while the residual fundamental is directed towards die 1305. The fundamental light enters the harmonic converter for a fourth time, generating second harmonic, which is then incident on beam splitter 1318 which is coated to be HR at the second harmonic and HT at the fundamental. The second harmonic is coupled out of the cavity as beam 1354, and the fundamental passes through the beam splitter and is incident on die 1305 where it is amplified and reflected to start another round trip through the cavity. Turning mirrors 1342, 1343 may be used to redirect the second harmonic beams 1352, 1354 so that all 4 generated beams are output from the laser system in substantially the same direction.

An advantage of the embodiment shown in FIG. 13 is that since the fundamental light passes through the length of the harmonic converter 4 times it is possible to either decrease the length of the converter while maintaining the same harmonic conversion efficiency, thus decreasing the cost and fabrication complexity of one of the key laser system components, or by maintaining the same length of harmonic converter, the efficiency of the harmonic converter may be increased thus allowing the harmonic conversion to be a larger part of the total cavity losses and thus increasing the laser system visible output power and efficiency.

Figure 14:
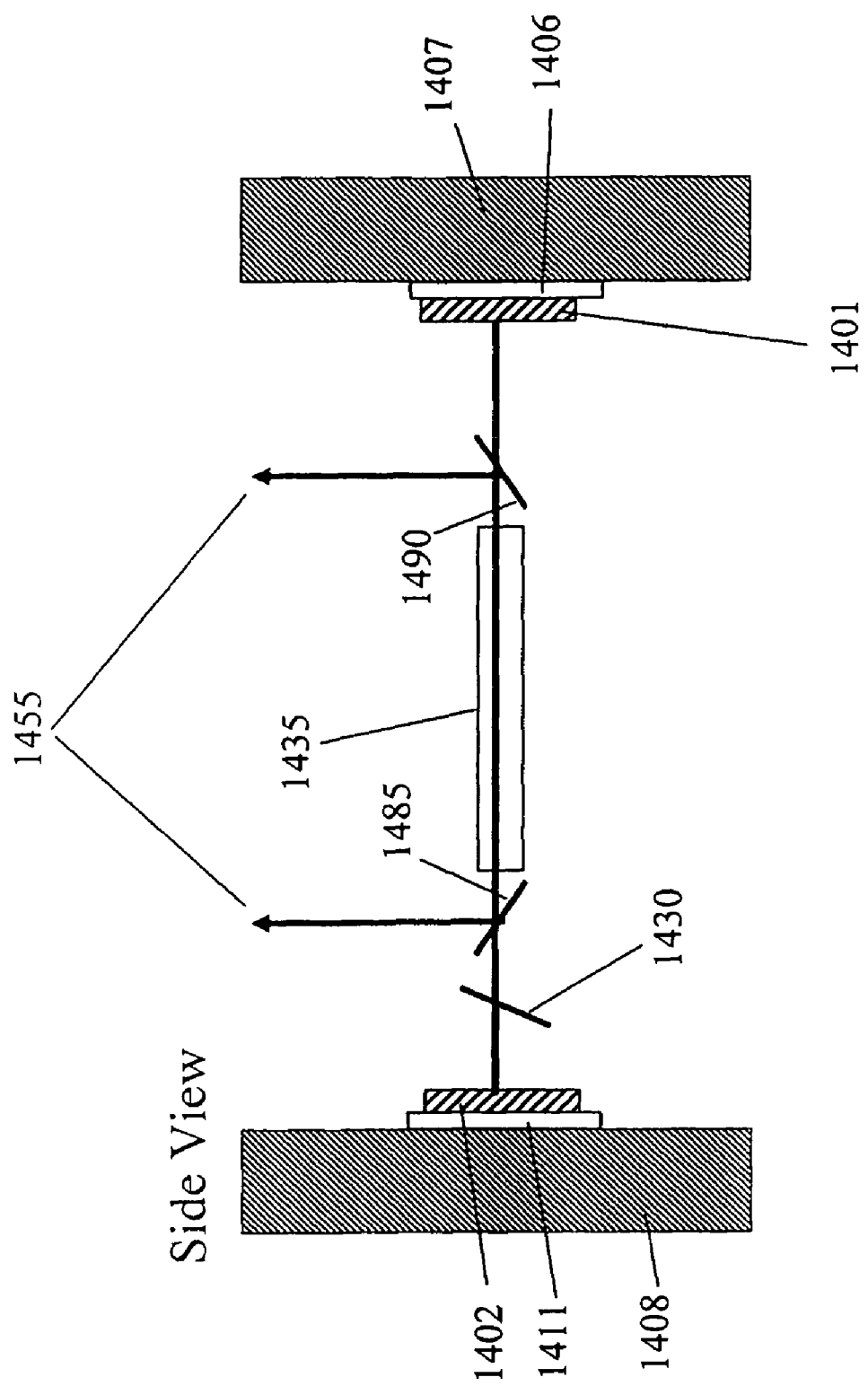
FIG. 14 illustrates an alternative embodiment with more than two dies.

In another embodiment of the present invention, the semiconductor dies are mounted on different submounts/heatsinks, which allows different cavity orientations. In one implementation as illustrated in FIG. 14, two submounts/heatsinks 1407, 1408 are used and the two die 1401, 1402 are mounted facing each other. The harmonic converter 1435 is situated between them (e.g., approximately symmetrically between the two emitters). A spectral filter 1430 may be included to stabilize wavelength. Two polarizers and harmonic pickoffs 1485, 1490 may be included to stabilize circulating fundamental polarization and pick off the harmonically converted output. It should be noted that these two components 1485, 1490 do not have to be identical. One or both of the components may be used to provide polarization selectivity for the fundamental (infra-red) cavity mode, but both components are required to perform the second harmonic pick off function, requiring a high reflectivity coating for the second harmonic wavelength. These components may be fabricated by well known thin film coating techniques including Ion Beam Sputter deposition. Note that an advantage of the cavity design illustrated in FIG. 14 is that no turning mirrors are required.

Figure 15:
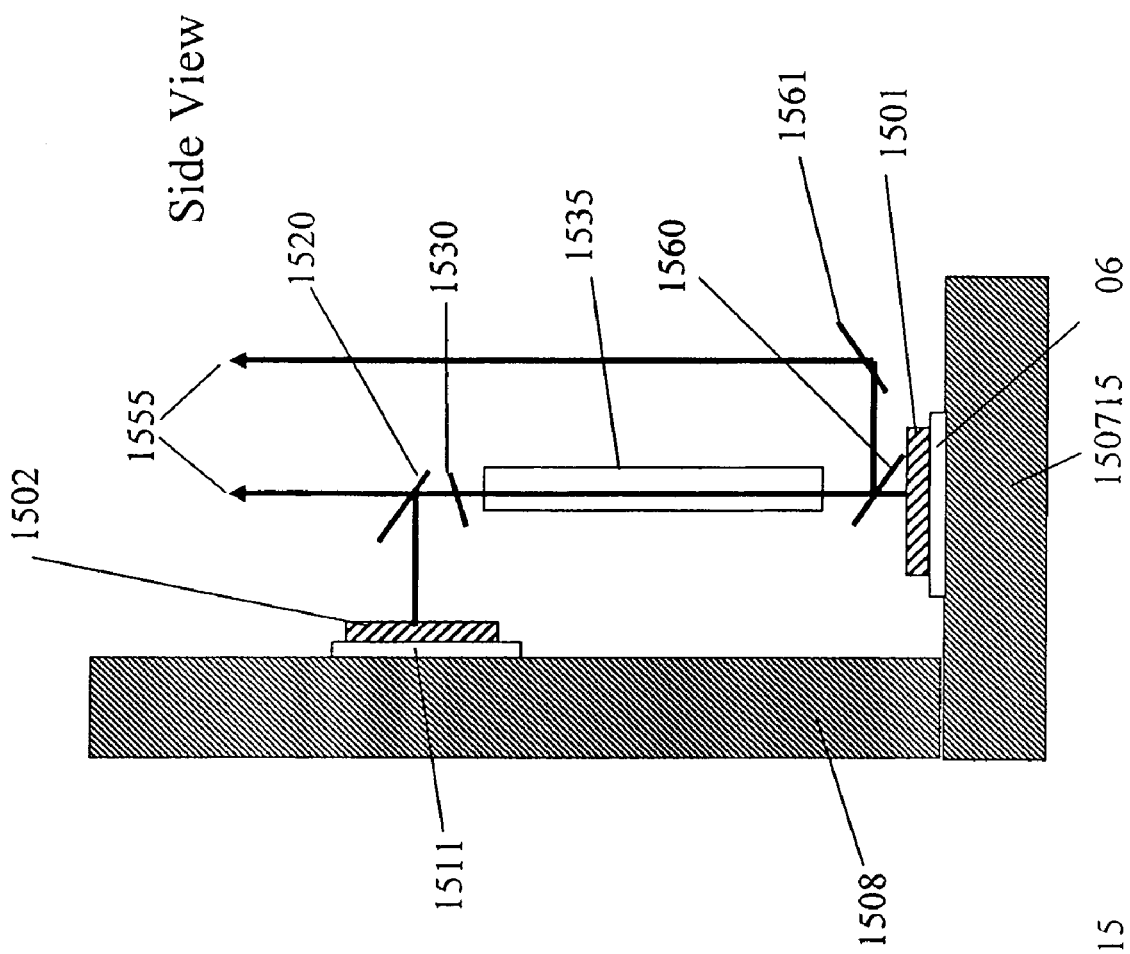
FIG. 15 illustrates an alternative embodiment with an edge emitting semiconductor gain element.

In another embodiment with two submounts, the two die 1501, 1502 are mounted on two submounts 1507, 1508 which are oriented perpendicular to each other as shown in FIG. 15 to create an L-shaped extended cavity. An advantage of this geometry is that one turning mirror is eliminated. An intra cavity lens (not shown) may be used to stabilize the cavity. The intra cavity lens element may be fabricated on the die or could be a discrete element.

Figure 16:
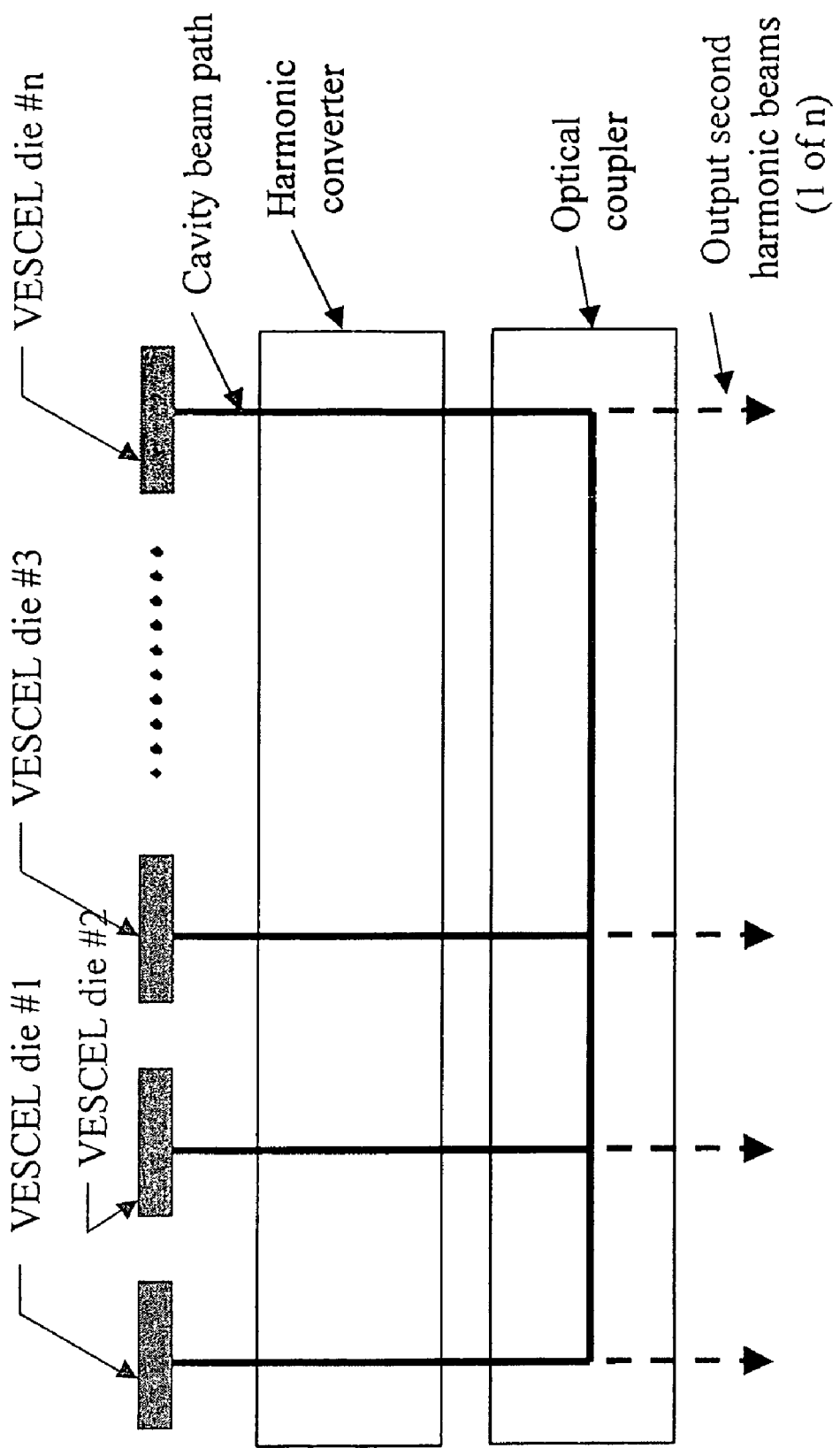
FIG. 16 illustrates two VESCEL dies serially arranged in a single cavity.

Embodiments of the present invention include extensions that use more than two VECSEL dies in a cavity. FIG. 16 shows an arrangement with more than two VECSEL dies, serially arranged, in a single cavity. An advantage of this embodiment is that it allows higher output power from a single laser cavity. The optical coupler couples light between the VECSEL dies to form a single effective optical extended cavity.

The serial architecture may be used to achieve a number of different benefits. The serial architecture improves optical efficiency. The serial arrangement of emitters increases cavity gain faster than increases in cavity loss caused by the serial extended cavity design architecture. As a consequence, the serial architecture enables higher circulating fundamental powers to be achieved, which results in higher second harmonic conversion efficiency. Additionally, the serial architecture improves the capability to place a harmonic converter at the waist of the cavity mode, which in turn yields higher optical intensities and optimal conversion efficiency.

The serial architecture improves electrical efficiency. Each die can be conveniently arranged electrically in series, which reduces the required current compared with driving the dies (electrically) in parallel. For example, with two dies electrically coupled in series, the current required to drive two emitters is reduced by half compared with operating both dies in parallel. This is a significant advantage in system design because electrical drivers are more efficient for a high voltage low current source than for a high current low voltage source.

The serial architecture permits higher output powers to be achieved. This is due to the higher intra-cavity intensity, and improved conversion efficiency, which results in higher output power for the same number of emitters. As previously described, the output power scales with the number of die operated in series, i.e., a two-fold improvement for a series architecture with two dies is achieved with the present invention. A two-fold improvement in optical power from a VECSEL is a dramatic increase in output power that enables many applications. Moreover, the improved optical power output can also be achieved simultaneously with other optical characteristics desirable for display applications.

The serial architecture also permits the mode quality to be improved (for a given output power) because a high output power can be achieved with a reduced number of emitting beams compared with a conventional parallel architecture. The number of emitting beams is reduced by the ratio of emitters to laser cavities. In turn, fewer emitted beams implies higher beam quality. Fewer emitted beams also makes it easier to focus and concentrate light and also makes it easier to couple the output to an optical fiber or mode mixing light guide.

The serial architecture also has cost advantages in system applications compared with a purely parallel architecture. Compared with a purely parallel architecture, the serial architecture permits the same or higher output power to be generated from a smaller package with smaller components. The serial architecture permits smaller volumes of expensive components, such as mirrors and nonlinear optical harmonic converter materials, which reduces system cost.

The serial architecture also provides benefits to packaging. All of the waste heat can be removed from a single surface. Most of the laser path can be arranged to be parallel to the emitter surface. The architecture also allows for more 2-dimensional packaging and is thus suitable for mass production.

In a variety of applications, such as display applications, it is desirable to have a light source capable of generating light over a broad range of visible wavelengths. For display applications it is particularly useful to generate red, green, and blue wavelengths for a three color display. Moreover, some display applications require comparatively high power levels at each wavelength. Unfortunately, it is typically more difficult to design VECSELs emitting high output power at the red wavelengths than blue or green wavelengths. Thus, the serial architecture—which permits increases in output power—is particularly beneficial for display applications requiring high output powers at red wavelengths. For large screen rear projection TV applications it is desirable to achieve a compact package that produces approximately 3W of optical power. Embodiments of the present invention permit a compact package to achieve the desired 3W for large screen rear projection TV applications. Embodiments of the present invention include both single cavity embodiments and embodiments in which there an array of cavities over a broad wavelength range. Moreover, while projection TV is one application, the present invention may be used as a compact multi-colored light source light engine utilized in multiple display applications besides large screen rear projection TV.

The serial architecture also reduces speckle. The serial architecture permits longer cavity lengths to be used, which decreases the axial mode spacing. The axial mode spacing may be selected such that the closer mode spacing combined with higher gain increases number of oscillating modes. In turn, the increased number of oscillating modes reduces speckle.

Figure 17:
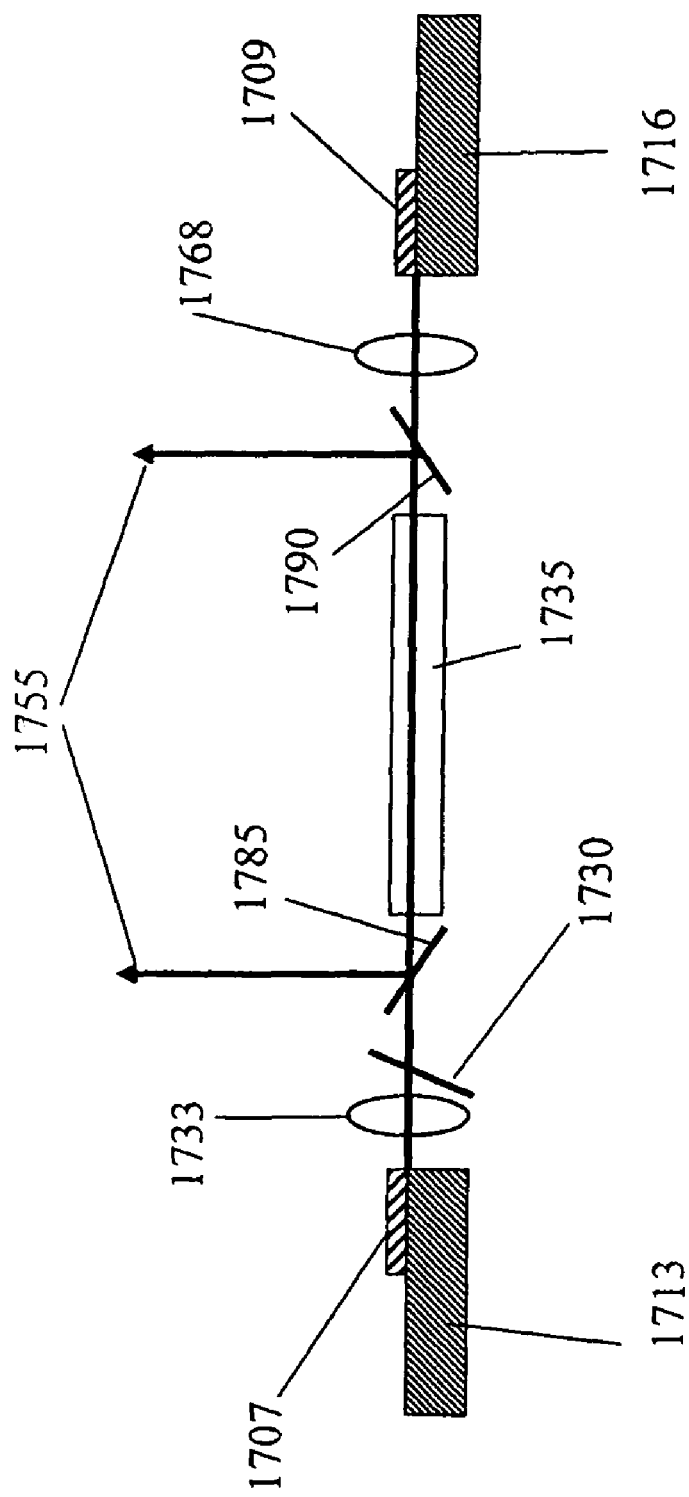
FIG. 17 illustrates an embodiment of the present invention in which the serial architecture is applied to edge emitting laser dies.

The serial architecture described in the previous examples may also be extended to utilize other types of laser dies besides VECSEL dies. FIG. 17 illustrates an alternate embodiment in which the serial architecture is applied to edge emitting laser dies 1707, 1709. For example, the VECSEL dies could be replaced by another type of semiconductor source, particularly edge emitting laser diodes, for example a Fabry-Perot, DBR or DFB. However, other types of semiconductor light sources typically have a higher divergence, which will require at least one lens in cavity to compensate for the divergence. FIG. 17 illustrates an alternate embodiment in which the serial architecture is applied to edge emitting laser die.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An extended cavity surface emitting laser, comprising:
a first laser die with a first cavity and a first gain element;
a second laser die with second cavity and a second gain element, the first and second gain elements being in series to provide optical gain and optical feedback in an extended optical cavity configuration; and
wherein the first and second gain elements provide optical gain and optical feedback in a common extended cavity to provide that the first and second gain elements operate serially as a common extended cavity optical mode.

2. The laser of claim 1, wherein a round trip through the extended cavity provides that a photon at a fundamental frequency traverses the first and second gain elements of the dies serially.

3. The laser of claim 1, wherein each of the first and second laser dies includes a substrate, semiconductor gain layers, Distributed Bragg Reflector (DBR) mirror layers, electrical contacts and current limiting apertures that restrict an electrical pumping current to the area of a desired gain element.

4. The laser of claim 3, wherein the electrical contacts and the current limiting apertures define a size and shape of a laser emitter.

5. The laser of claim 1, further comprising:
a submount coupled to the first and second dies.

6. The laser of claim 5, wherein the submount is a heatsink.

7. The laser of claim 1, further comprising:
a carrier that provides a mount for the first and second dies.

8. The laser of claim 1, wherein the first and second dies are symmetric to provide similar optical characteristics.

9. The laser of claim 1, further comprising:
first and second external turning mirrors positioned on each of a side of a die.

10. The laser of claim 9, wherein the first and second turning mirrors are aligned to direct emission of the first and second dies towards each and form a single laser cavity.

11. The laser of claim 10, further comprising:
a nonlinear optic harmonic converter positioned in the laser cavity to convert a fundamental emission wavelength to a second harmonic wavelength.

12. The laser of claim 11, wherein the harmonic converter is positioned at or around a midpoint of the laser cavity.

13. The laser of claim 11, wherein the harmonic converter is mounted on a temperature controlled plate.

14. The laser of claim 13, wherein the temperature controlled plate provides a sufficiently uniform temperature environment for the harmonic converter such that a phase-matching condition is uniform throughout the harmonic converter.

15. The laser of claim 13, wherein the temperature controlled plate is configured to provide a non-uniform temperature environment for the harmonic converter.

16. The laser of claim 11, wherein the harmonic converter is configured to receive fundamental light traveling in two opposed directions through the harmonic converter.

17. The laser of claim 16, wherein a second harmonic beam is generated in the harmonic converter in a first direction and a second, opposite direction.

18. The laser of claim 17, wherein only one of the second harmonic beams is output.

19. The laser of claim 17, wherein the second harmonic beam that travels in the opposite direction is redirected to provide that both second harmonic beams are output in a same direction, substantially parallel to each other.

20. The laser of claim 1, wherein the common extended cavity supports a fundamental Gaussian mode and is operated in the fundamental Gaussian mode.

21. The laser of claim 1, wherein a gain region of the common extended cavity includes one or more quantum wells positioned in regions of high optical field strength.

22. The laser of claim 21, wherein current injected into the quantum wells through an aperture causes optical gain.

23. The laser of claim 22, wherein the current creates a thermally induced lens.

24. The laser of claim 23, wherein the thermal lens provides stability to the common extended cavity transverse mode, and a strength of the thermal lens determines a mode size of a fundamental Gaussian mode within the common extended cavity.

25. The laser of claim 11, wherein the harmonic converter is positioned symmetrically about a waist of a cavity mode of the laser.

26. The laser of claim 1, wherein the first die includes a first array of emitters and the second die includes a second array of emitters, the first gain element being included within an emitter within the first array and the second gain element being included within an emitter within the second array.

27. The laser of claim 26, wherein each emitter within the first array of emitters has two gain elements.

28. The laser of claim 26, wherein each emitter within the first array of emitters has two gain elements that operate in parallel.

29. The laser of claim 1, further comprising:
a spectral filter.

30. The laser of claim 29, wherein the spectral filter is a Fabry Perot etalon that provides high transmission for only a selected wavelength and spectral bandwidth.

31. The laser of claim 28, wherein a lateral distance between centers of gain regions on the first and second die remains constant over a full width of the first and second dies.

32. The laser of claim 31, wherein a maximum displacement of a center of any gain region is less than 10 microns.

33. An extended cavity surface emitting laser system comprising:
at least two electrically pumped surface emitting gain elements each having an internal Bragg reflector, each surface emitting gain element spaced apart from each other and generating light at a fundamental frequency;
an optical coupler to couple the emission output of each surface emitting gain element in series as part of a common extended cavity;
a harmonic converter to provide intra-cavity frequency doubling; and
an output coupler to extract frequency doubled light.

34. The laser system of claim 33, further comprising an intracavity spectral filter.

35. The laser cavity of claim 33, further comprising an intracavity polarizer.

36. The laser system of claim 33, wherein the surface emitting gain elements are disposed at opposite ends of the extended cavity.

37. The laser system of claim 36, wherein two of the surface emitting gain elements face each other.

38. The laser system of claim 33, wherein the output coupler comprises a dichroic element to pick off and output frequency doubled light generated by the harmonic converter.

39. The laser system of claim 38, wherein the output coupler further acts as a polarizer.

40. A laser system comprising:
at least two electrically pumped surface emitting gain elements to generate light at a fundamental frequency, each surface emitting gain element having an internal Bragg reflector;
means for optically coupling the surface emitting gain elements in series into a common extended cavity;
an intracavity harmonic converter to perform frequency doubling; and
an output coupler to extract frequency doubled light.

41. An extended cavity surface emitting laser system, comprising:
at least two electrically pumped surface emitting gain elements spaced apart from each other to generate light at a fundamental frequency, each surface emitting gain element including a Bragg reflector;
an optical coupler that couples emission output of each surface emitting gain element in series as part of a common extended cavity;
a harmonic converter to provide intra-cavity frequency doubling; and
an output coupler positioned to extract frequency doubled light from the common extended cavity; and
wherein the optical coupler includes at least one of, an intracavity lens, a mirror, a dichroic reflector, a prism, a beam splitter, a high refractive index element, an optical tuning element, a turning mirror and a grating.

42. The system of claim 41, wherein the optical coupler re-directs an optical path of an extended cavity mode at least once within the common extended cavity.

43. The laser system of claim 41, wherein at least two of the surface emitting gain elements are disposed on a common die.

44. The laser system of claim 41, wherein at least two of the surface emitting gain elements are disposed on separate dies.

45. The laser system of claim 41, further comprising:
an intracavity polarizer.

46. The laser system of claim 41, wherein the optical coupler utilizes at least one prism to redirect light from one surface emitting gain element to the other.

47. The laser system of claim 41, wherein the optical coupler utilizes at least one mirror to redirect light from one surface emitting gain element to another.

48. An extended cavity surface emitting laser system comprising:
at least two electrically pumped surface emitting gain elements spaced apart from each other to generate light at a fundamental frequency, each surface emitting gain element including a Bragg reflector;
an optical coupler to couple the emission output of each surface emitting gain element in series as part of a common extended cavity;
a harmonic converter that provides intracavity frequency doubling; and
wherein the common extended cavity is a folded cavity that makes at least one turn along an optical path of the extended cavity.

49. The laser system of claim 48, wherein the extended cavity is folded into an L-shape.

50. The laser system of claim 48, wherein the extended cavity is folded into a U-shape.

51. A laser system comprising:
at least two electrically pumped surface emitting gain elements to generate light at a fundamental frequency, each surface emitting gain element having an internal Bragg reflector;
means for optically coupling the surface emitting gain elements in series into a folded common extended cavity in which the optical path of the extended cavity makes at least one turn;
an intracavity harmonic converter to perform frequency doubling; and
an output coupler to extract frequency doubled light.

* * * * *